US012267997B2

(12) United States Patent
Xu et al.

(10) Patent No.: US 12,267,997 B2
(45) Date of Patent: *Apr. 1, 2025

(54) MICROELECTRONIC DEVICES COMPRISING STACK STRUCTURES HAVING PILLARS AND ELLIPTICAL CONDUCTIVE CONTACTS

(71) Applicant: Micron Technology, Inc., Boise, ID (US)

(72) Inventors: Lifang Xu, Boise, ID (US); Sidhartha Gupta, Boise, ID (US); Kar Wui Thong, Boise, ID (US); Harsh Narendrakumar Jain, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/394,273

(22) Filed: Dec. 22, 2023

(65) Prior Publication Data

US 2024/0147713 A1  May 2, 2024

Related U.S. Application Data

(63) Continuation of application No. 17/205,954, filed on Mar. 18, 2021, now Pat. No. 11,856,763.

(51) Int. Cl.
*H10B 41/27* (2023.01)
*G11C 5/06* (2006.01)
(Continued)

(52) U.S. Cl.
CPC ............... *H10B 41/27* (2023.02); *G11C 5/06* (2013.01); *H01L 29/66666* (2013.01); *H01L 29/7827* (2013.01); *H10B 43/27* (2023.02)

(58) Field of Classification Search
None
See application file for complete search history.

(56) References Cited

U.S. PATENT DOCUMENTS 11,856,763 B2 * 12/2023 Xu ..................... H10B 43/27
2021/0066342 A1 * 3/2021 Furuki ............. H01L 21/76877
(Continued)

OTHER PUBLICATIONS

Clampitt et al., Microelectronic Devices Including Voids Neighboring Conductive Contacts, and Related Memory Devices, Electronic Systems, and Methods, filed Jan. 5, 2021, U.S. Appl. No. 17/141,722, 59 pages.

(Continued)

*Primary Examiner* — Hsien Ming Lee
(74) *Attorney, Agent, or Firm* — TraskBritt

(57) ABSTRACT

A method of forming a microelectronic device including a first stack structure comprising alternating levels of insulative structures and other insulative structures, forming strings of memory cells through the first stack structure, forming a second stack structure over the first stack structure, based at least partially on observed amount of pillar bending within the first stack structure, forming a first tailored reticle specific to the observed amount of pillar bending, utilizing the first tailored reticle to form openings extending through the second stack structure and over some of the strings of memory cells, wherein centers of the openings over the strings of memory cells are at least substantially aligned with the centers of uppermost surfaces of the strings of memory cells in a direction of the observed pillar bending, and forming upper pillars extending through the second stack structure and over some of the strings of memory cells.

20 Claims, 27 Drawing Sheets

(51) Int. Cl.
*H01L 29/66* (2006.01)
*H01L 29/78* (2006.01)
*H10B 43/27* (2023.01)

(56) References Cited

U.S. PATENT DOCUMENTS

| | | | |
|---|---|---|---|
| 2022/0077177 A1* | 3/2022 | Ullah | H10B 43/10 |
| 2022/0157719 A1 | 5/2022 | Luo et al. | |
| 2022/0199641 A1 | 6/2022 | Fukuzumi et al. | |

OTHER PUBLICATIONS

Fukuzumi et al., Microelectronic Devices Including Tiered Stacks Including Conductive Structures Isolated by Slot Structures, and Related Electronic Systems and Methods, filed Dec. 18, 2020, U.S. Appl. No. 17/127,971, 59 pages.

* cited by examiner

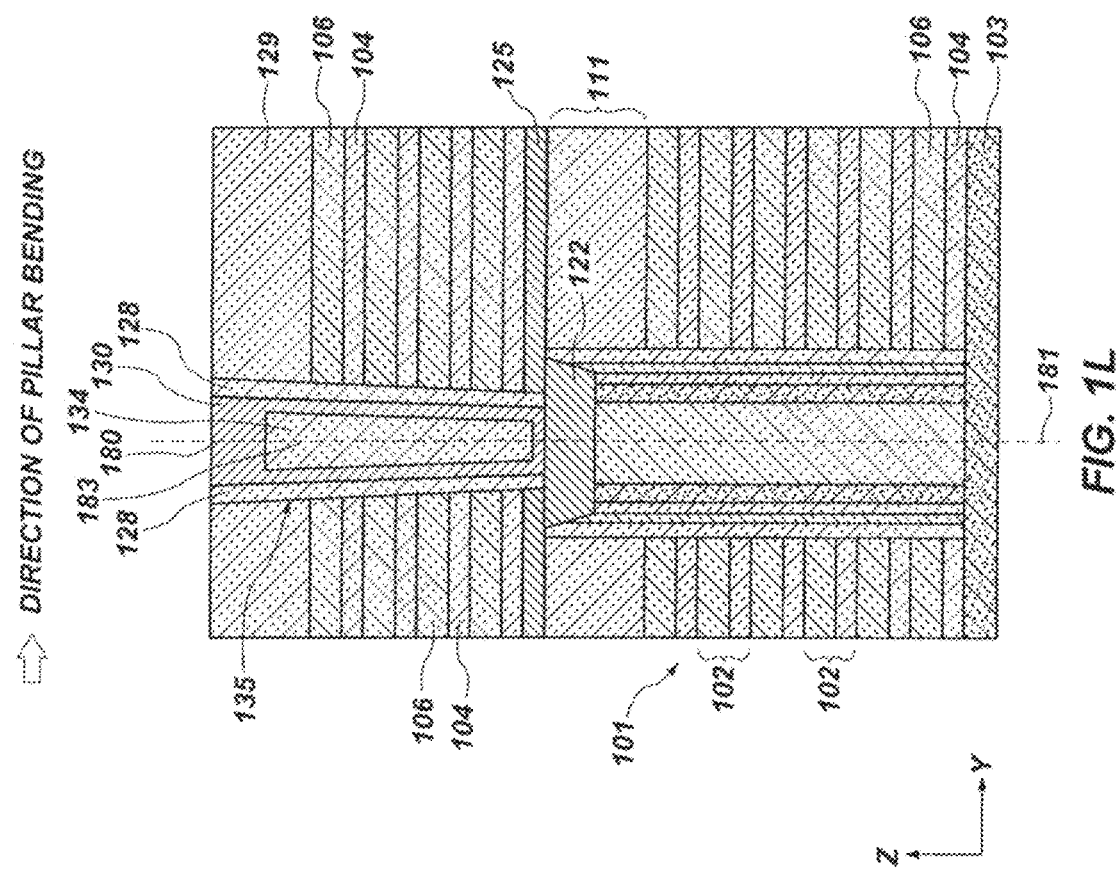

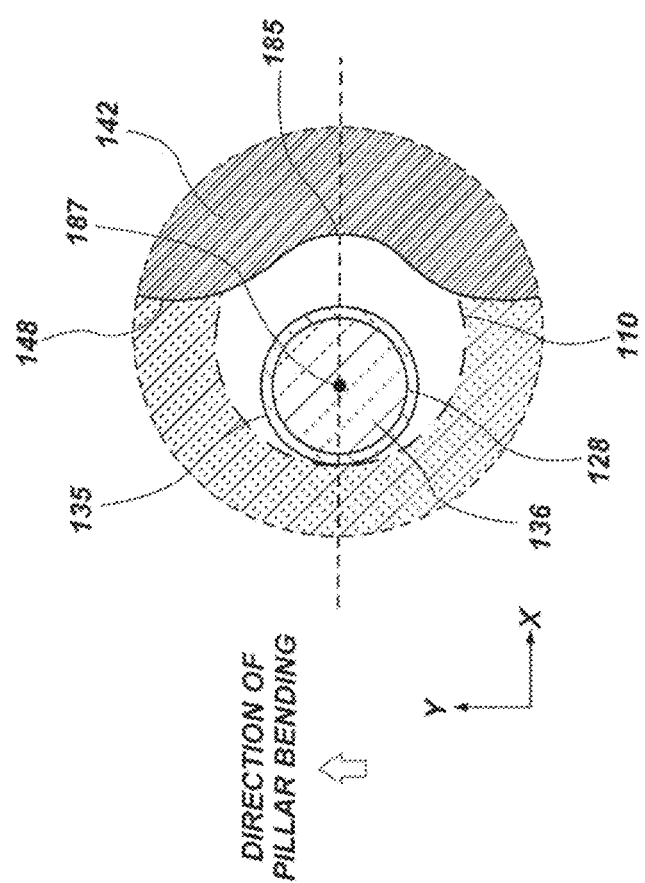

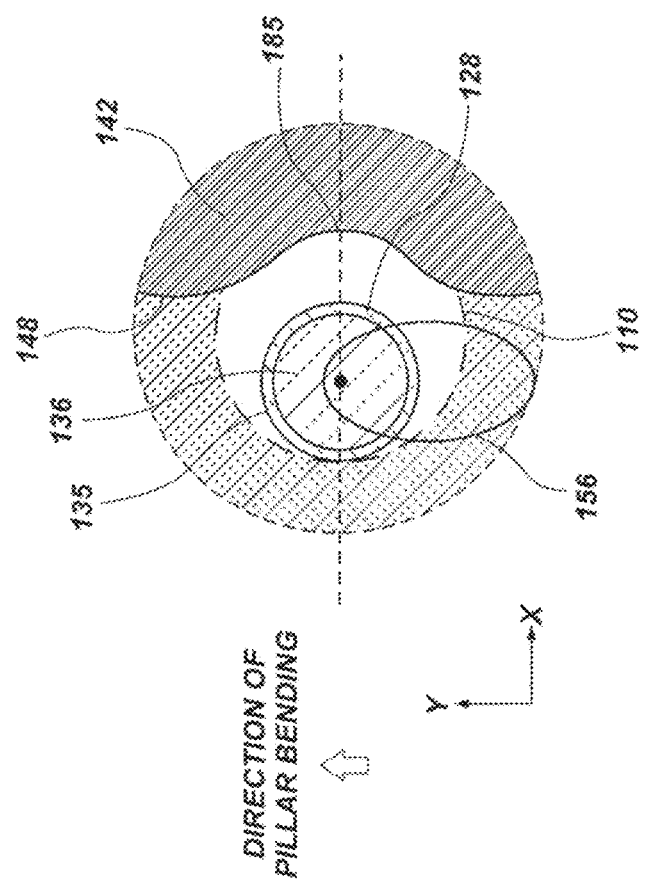

ized representations that are employed to describe embodiments herein. Elements and features common between figures may retain the same numerical designation except that, for ease of following the description, reference numerals begin with the number of the drawing on which the elements are introduced or most fully described.

MICROELECTRONIC DEVICES COMPRISING STACK STRUCTURES HAVING PILLARS AND ELLIPTICAL CONDUCTIVE CONTACTS

CROSS-REFERENCE TO RELATED APPLICATION

This application is a continuation of U.S. patent application Ser. No. 17/205,954, filed Mar. 18, 2021, now U.S. Pat. No. 11,856,763, issued on Dec. 26, 2023, the disclosure of which is hereby incorporated herein in its entirety by this reference.

TECHNICAL FIELD

The disclosure, in various embodiments, relates generally to the field of microelectronic device design and fabrication. More specifically, the disclosure relates to methods of forming microelectronic devices, and to related microelectronic devices, memory devices, and electronic systems.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including tiers of conductive structures and dielectric materials. Each vertical memory string may include at least one select device coupled in series to a serial combination of vertically-stacked memory cells. Such a configuration permits a greater number of switching devices (e.g., transistors) to be located in a unit of die area (e.g., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the deck(s) (e.g., stack structure(s)) of the memory device and access lines (e.g., bit lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the deck(s) of the memory device. The staircase structure includes individual "steps" defining contact regions of the conductive structures, upon which conductive contact structures can be positioned to provide electrical access to the conductive structures.

As vertical memory array technology has advanced, enhanced memory density has been provided by forming memory devices to exhibit multiple deck (e.g., dual deck) configurations. For example, in one conventional dual deck configuration, some vertical memory strings are located in an upper deck (e.g., an upper stack structure), and additional vertical memory strings are located in a lower deck (e.g., a lower stack structure) underlying the upper deck. The vertical memory strings of the upper deck may be electrically coupled to the additional vertical memory strings of the lower deck (e.g., by way of conductive interconnect structures), or the vertical memory strings of the upper deck may be electrically isolated from the additional vertical memory strings of the lower deck (e.g., by way of an intervening dielectric material). Unfortunately, as feature packing densities have increased and margins for formation errors have decreased, conventional memory device formation methods and associated configurations have resulted in undesirable stresses (e.g., access line contact over etch stresses), defects (e.g., access line contact punch through) and current leaks (e.g., select gate current leakage, access line current leakage) that can diminish desired memory device performance, reliability, and durability.

Additionally, a continued goal in the microelectronic device fabrication industry is to improve the performance of devices, e.g., 3D NAND memory devices, by decreasing the electrical resistance and/or electrical capacitance of word lines. However, efforts to decrease electrical resistance and/or capacitance of the word lines may negatively impact other aspects of device design and fabrication, such as by causing pillar bending in areas of the device adjacent the staircase structures. Therefore, designing and fabricating microelectronic devices, such as 3D NAND memory devices, with decreased electrical resistance and/or capacitance and without pillar bending continues to present challenges.

DETAILED DESCRIPTION

Figure 1A:
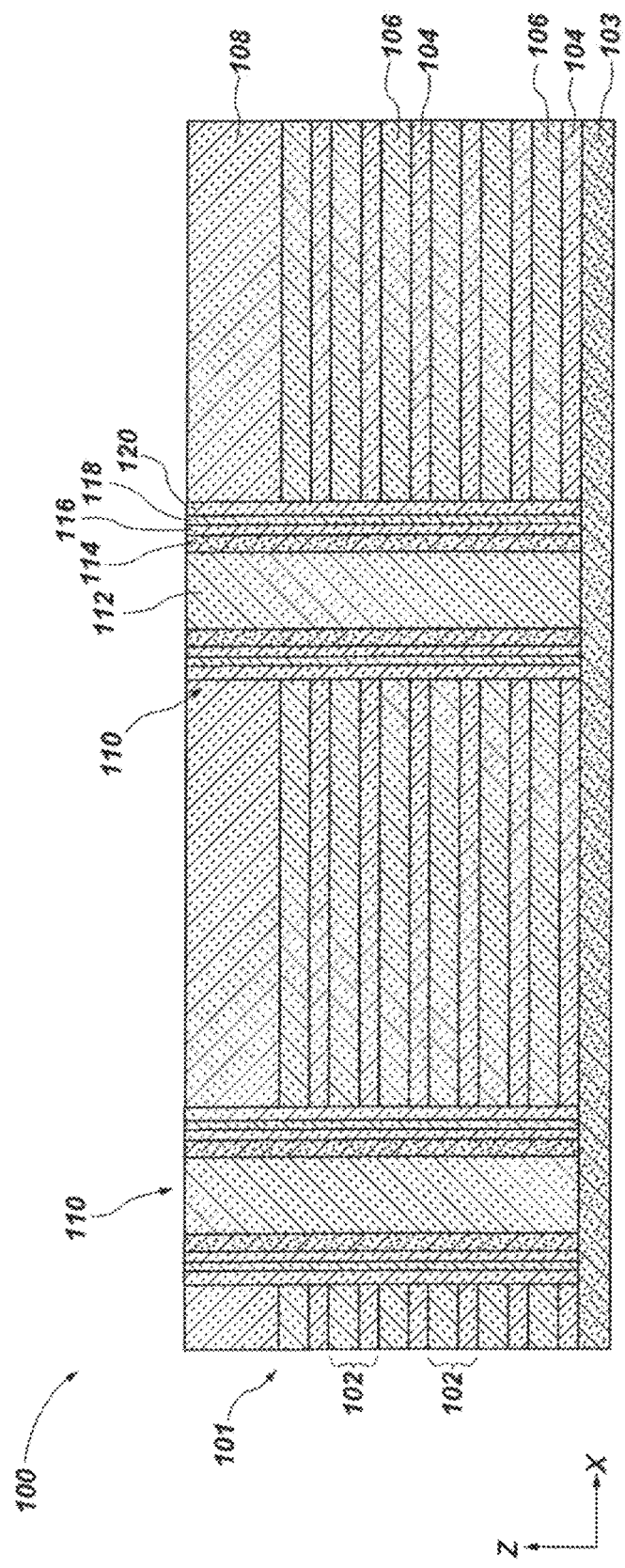
FIG. 1A through FIG. 1X are simplified cross-sectional views (FIG. 1A, FIG. 1C, FIG. 1D, FIG. 1F through FIG. 1M, FIG. 1O, FIG. 1P, FIG. 1Q, FIG. 1T, FIG. 1U, FIG. 1W, and FIG. 1X) and top-down views (FIG. 1B, FIG. 1E, FIG. 1N, FIG. 1R, FIG. 1S, and FIG. 1V) illustrating a method of forming a microelectronic device structure, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes a microelectronic device exhibiting memory functionality, but not necessarily limited to memory functionality. Stated another way, and by way of non-limiting example only, the term "memory device" includes not only memory (e.g., volatile memory, such as DRAM; non-volatile memory, such as NAND memory), but also includes an application specific integrated circuit (ASIC) (e.g., a system on a chip (SoC)), a microelectronic device combining logic and memory, and a graphics processing unit (GPU) incorporating memory.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "middle," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, orientation, and arrangement of at least one feature (e.g., at least one structure, at least one region, at least one apparatus) facilitating operation of the at least one feature in a pre-determined way.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless otherwise indicated, the materials described herein may be formed by conventional techniques including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma-enhanced CVD), or epitaxial growth. Alternatively, the materials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise. Etch chemistries and etch conditions for etching a desired material may be selected by a person of ordinary skill in the art.

As used herein, the term "insulative material" includes one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, the insulative structures may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions.

As used herein, the term "conductive material" includes one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Jr), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RUO_x$), alloys thereof, a conductively-doped semiconductor material (e.g., conductively-doped polysilicon, conductively-doped germanium (Ge), conductively-doped silicon germanium (SiGe)), polysilicon, other materials exhibiting electrical conductivity, or combinations thereof.

As used herein, the terms "pillar misalignment" or "pillar bending" means that a center longitudinal axis of a pillar structure of a microelectronic device structure deviates from an ideal, true-vertical center longitudinal axis. As a non-limiting example, a pillar may lean or curve away from a true vertical orientation of the pillar. For example, a bottom portion of a pillar may be located and formed at an ideal location, but due to pillar bending, a top portion of the pillar may not be vertically aligned with the bottom surface of the pillar.

Embodiments of the disclosure include microelectronic device structures for microelectronic devices (e.g., memory devices), as well as related microelectronic devices (e.g., memory devices), electronic systems, and methods. In some embodiments, a microelectronic device structure of the disclosure includes strings of memory cells (e.g., pillars) extending through a stack structure including alternating levels of insulative structures and conductive structures, the strings of memory cells exhibiting pillar bending in a first direction, upper pillars within an additional stack structure including alternating levels of additional insulative structures and additional conductive structures, centers of lowermost surfaces of the upper pillars being substantially aligned with respective centers of uppermost surfaces of the strings of memory cells in the first direction, slot structures extending at least partially through the stack structure, the slot structures individually exhibiting a non-linear shape, elliptical conductive contacts contacting uppermost surfaces of the upper pillars, ellipse cross-sections of the elliptical conductive contacts have major axes extending in the first direction, and access lines in electrical contact with the elliptical conductive contacts and extending in a second direction perpendicular to the first direction.

Embodiments of the disclosure include utilizing one or more tailored reticles to form openings within which the upper pillars are formed. The openings may be formed to accommodate for pillar bending exhibited by the strings of memory cells (e.g., pillars within the stack structure). Additionally, embodiments of the disclosure include utilizing tailored reticles to form elliptical openings within a hardmask material over the upper pillar and within which the elliptical conductive contacts are formed. The size and shape of ellipses defined by the elliptical contacts may be at least partially determined by observed pillar bending by the strings of memory cells (e.g., pillars within the stack structure) to accommodate (e.g., compensate for) the observed degree of pillar bending. In some embodiments, the tailored reticles may be formed (i.e., designed and fabricated) in real time. For example, the tailored reticles may be formed during the process of forming the microelectronic device structure based on observed pillar bending for the microelectronic device structure. In other embodiments, the tailored reticles may be formed for observed and/or expected amounts of pillar misalignment and/or pillar bending, and the tailored reticles may be selected from the formed tailored reticles and utilized to form the openings and elliptical openings of the microelectronic device structure. For example, the tailored reticles may be selected based on observed pillar misalignment and/or pillar bending and/or based on an anticipated pillar misalignment and/or pillar bending within the microelectronic device structure.

Utilizing tailored reticles to form openings and/or elliptical openings of the microelectronic device structure based on observed pillar misalignment and/or pillar bending may be advantageous over conventional methods for forming microelectronic device structure. For example, in comparison to conventional methods and structures exhibiting pillar misalignment and/or pillar bending, utilizing tailored reticles to form openings and/or elliptical openings of the microelectronic device structure based on observed pillar misalignment and/or pillar bending may improve overlap between the pillars and the upper pillar structures. As a result, an electrical connection between the pillars and the upper pillar structures may be improved.

Furthermore, in comparison to conventional methods and structures exhibiting pillar misalignment and/or pillar bending, utilizing tailored reticles to form openings and/or elliptical openings of the microelectronic device structure based on observed pillar misalignment and/or pillar bending may improve overlap between the elliptical conductive contacts and the upper pillar structures and thus, may improve electrical connections between the elliptical conductive contacts and the upper pillar structures. Additionally, utilizing tailored reticles to form the elliptical openings based on observed pillar misalignment and/or pillar bending may improve overlap between the elliptical conductive contacts and the access lines (e.g., bit lines), which may have a fixed location within the microelectronic device structure, even when the microelectronic device structure exhibits pillar misalignment and/or pillar bending. For example, the elliptical shape of the elliptical openings and the elliptical conductive contacts relative to a circular shape, as in conventional structures exhibiting pillar misalignment and/or pillar bending, improves overlap between the elliptical conductive contacts and the access lines (e.g., bit lines). In view of the foregoing, by accommodating and/or compensating from pillar bending within the microelectronic device structure, dummy pillars (e.g., a dummy pillar area) within the microelectronic device structure may be reduced relative to conventional structures.

Figure 1B:
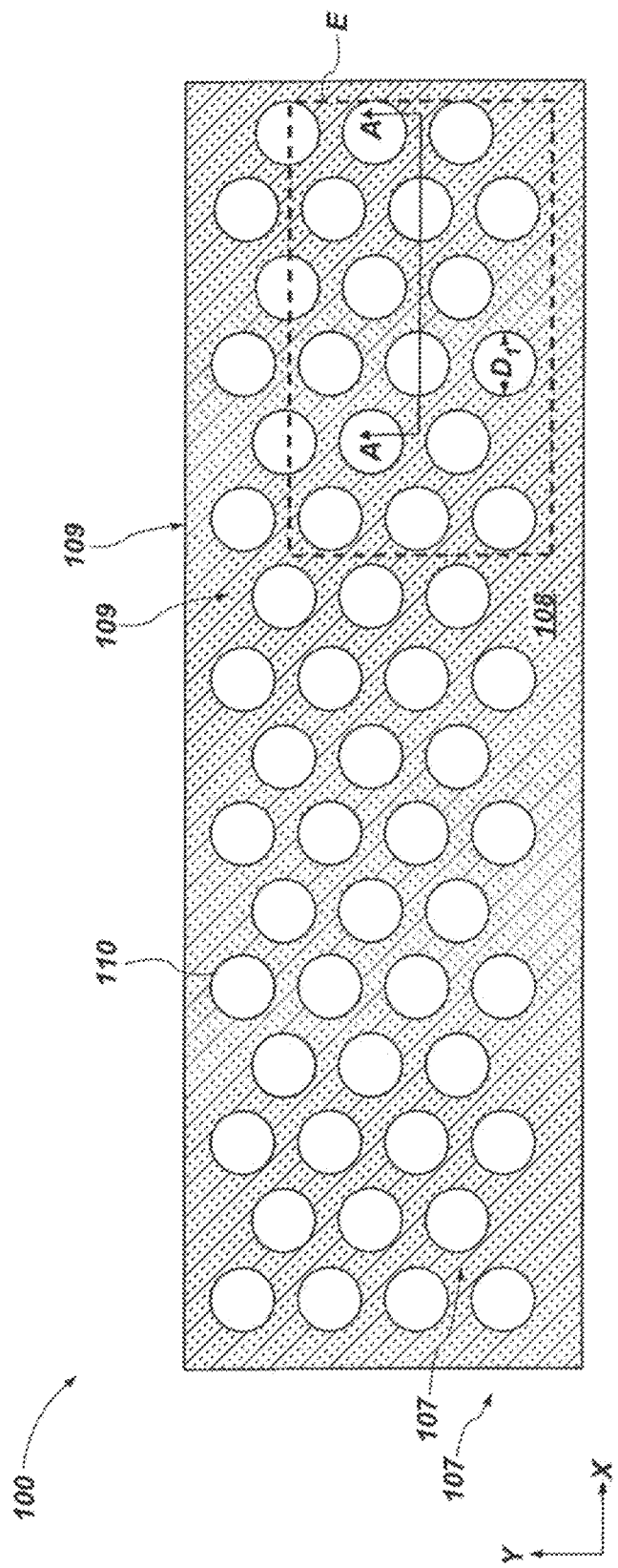
Figure 1C:
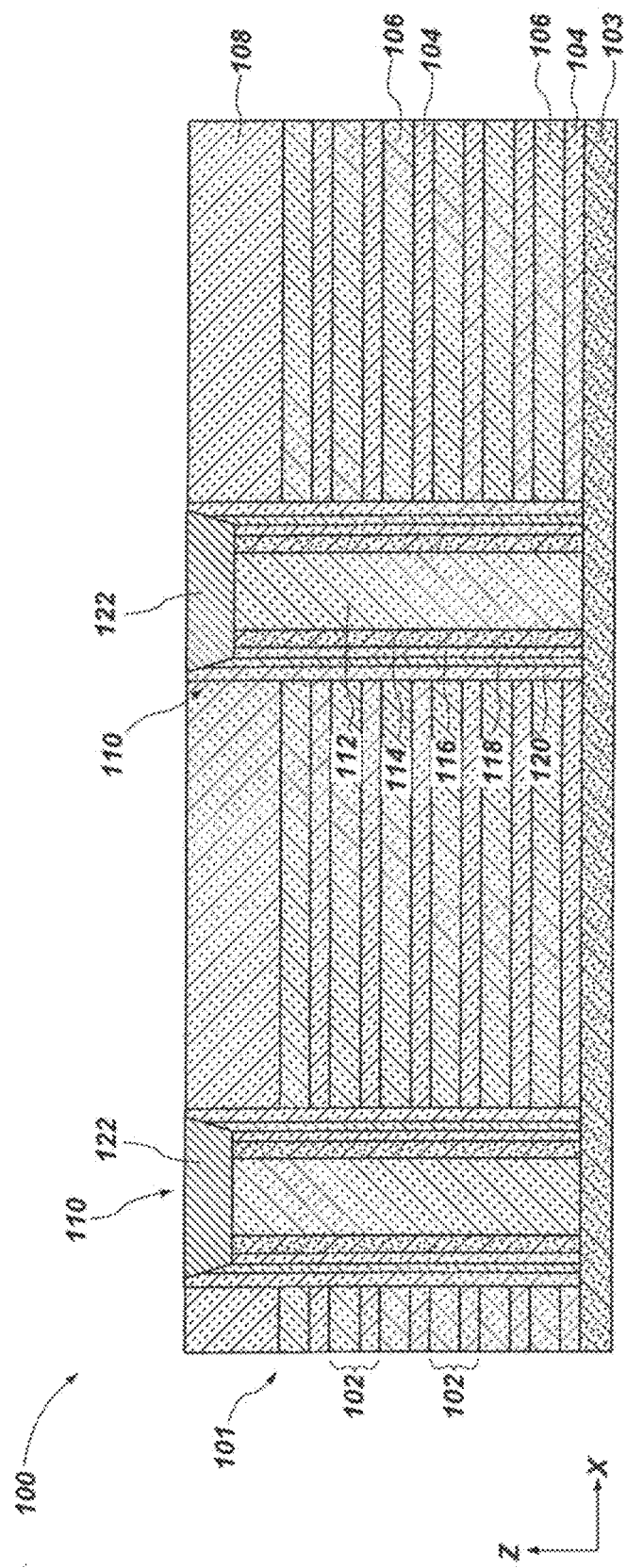
Figure 1D:
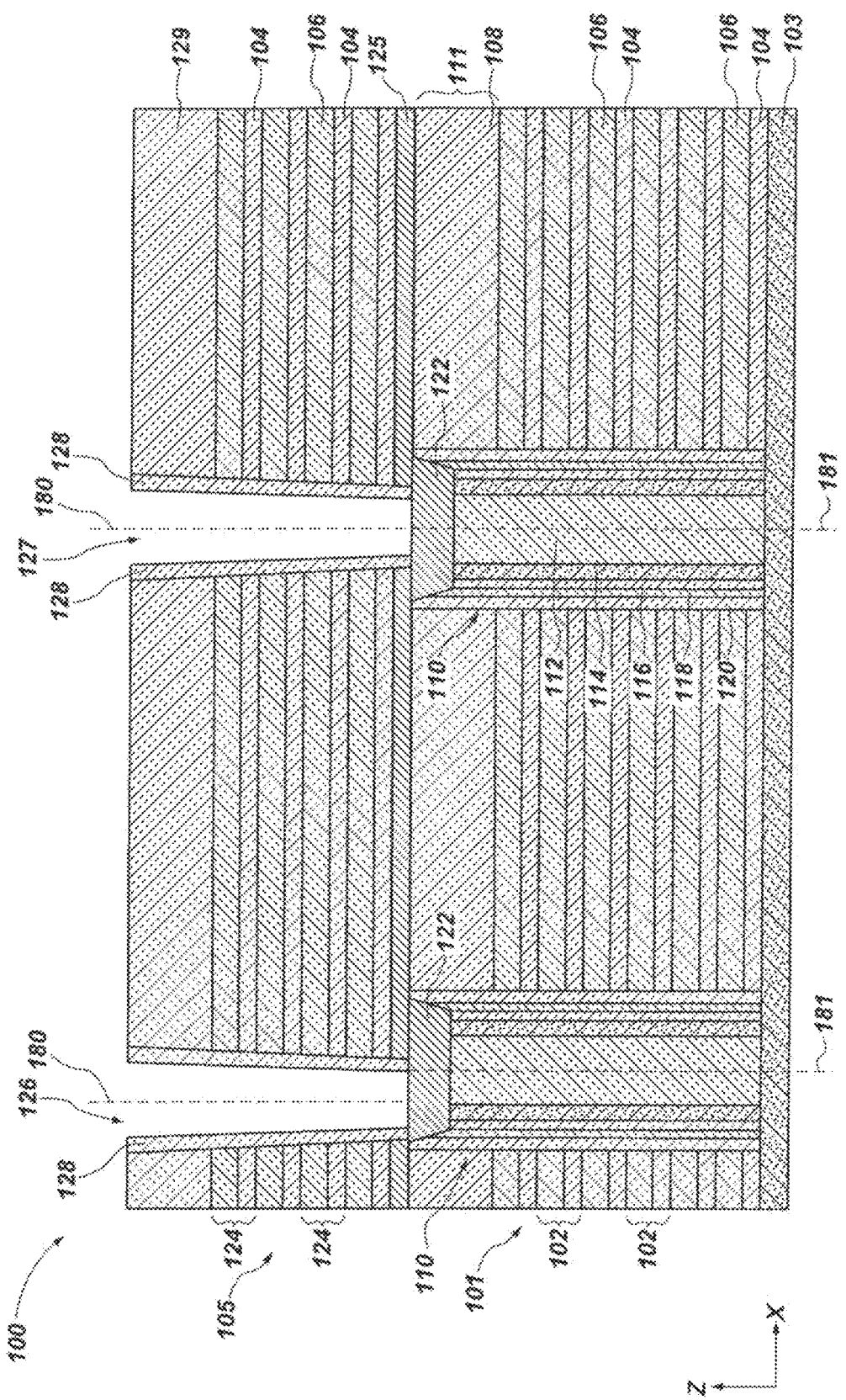
Figure 1E:
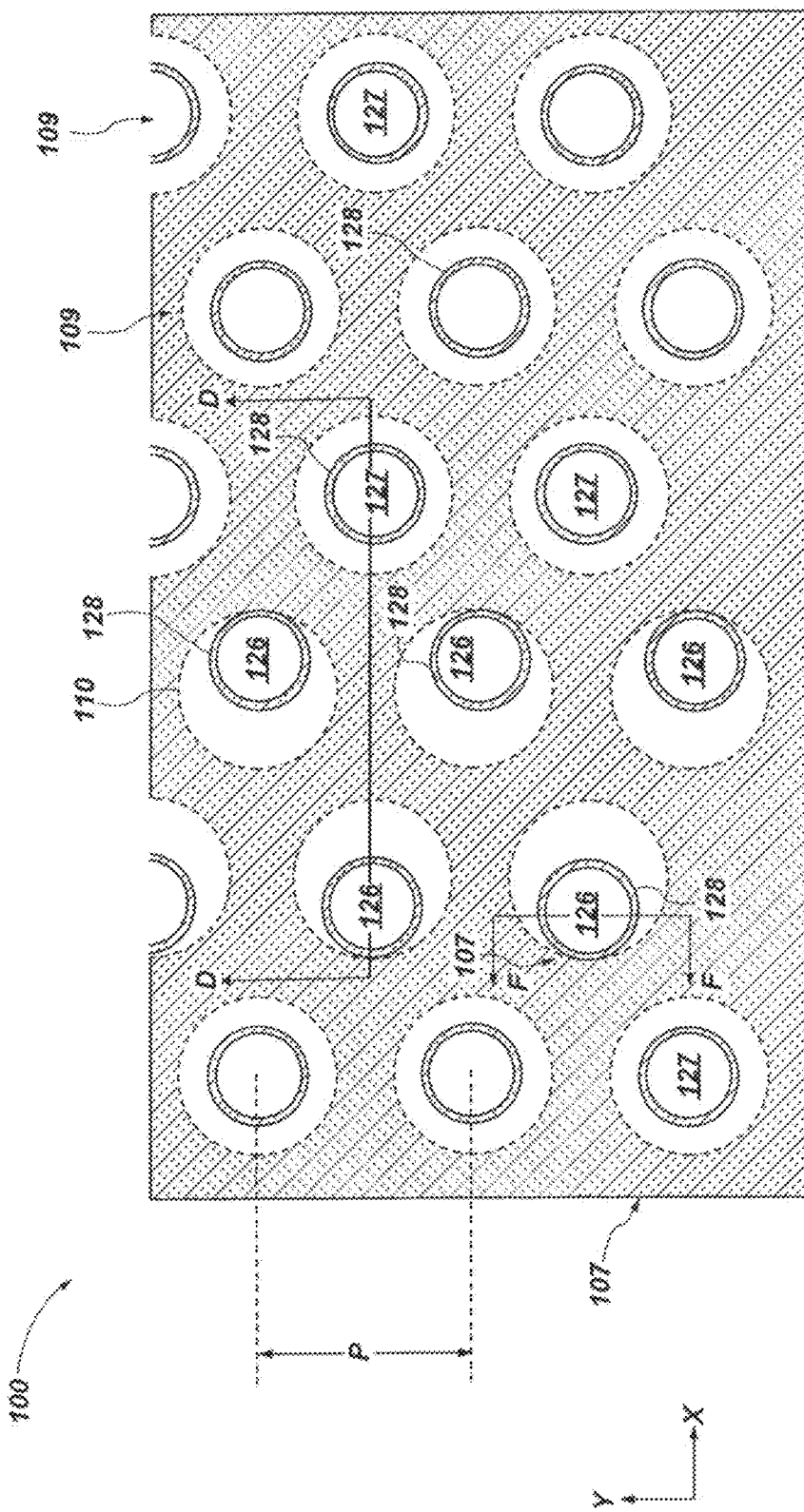
Figure 1F:
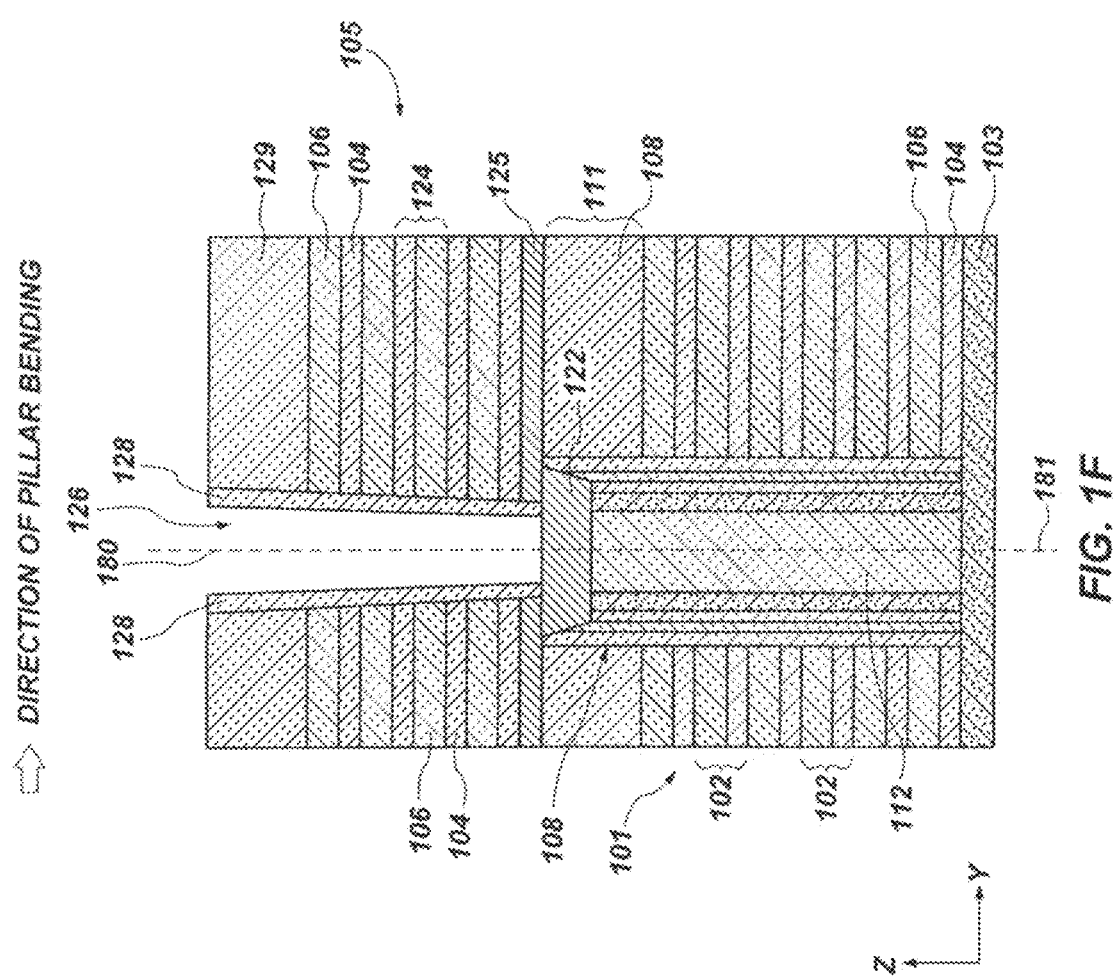
Figure 1G:
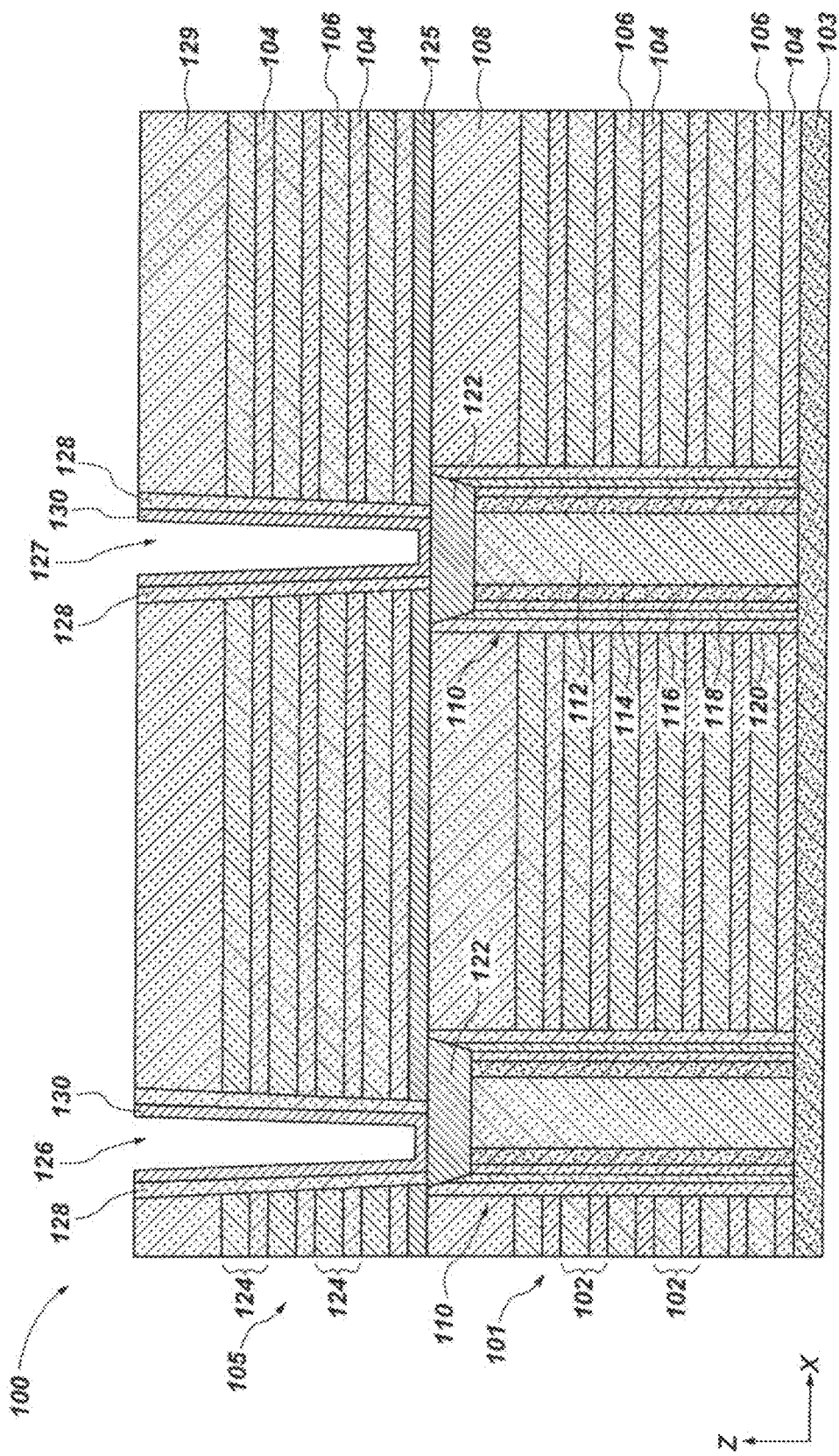
Figure 1H:
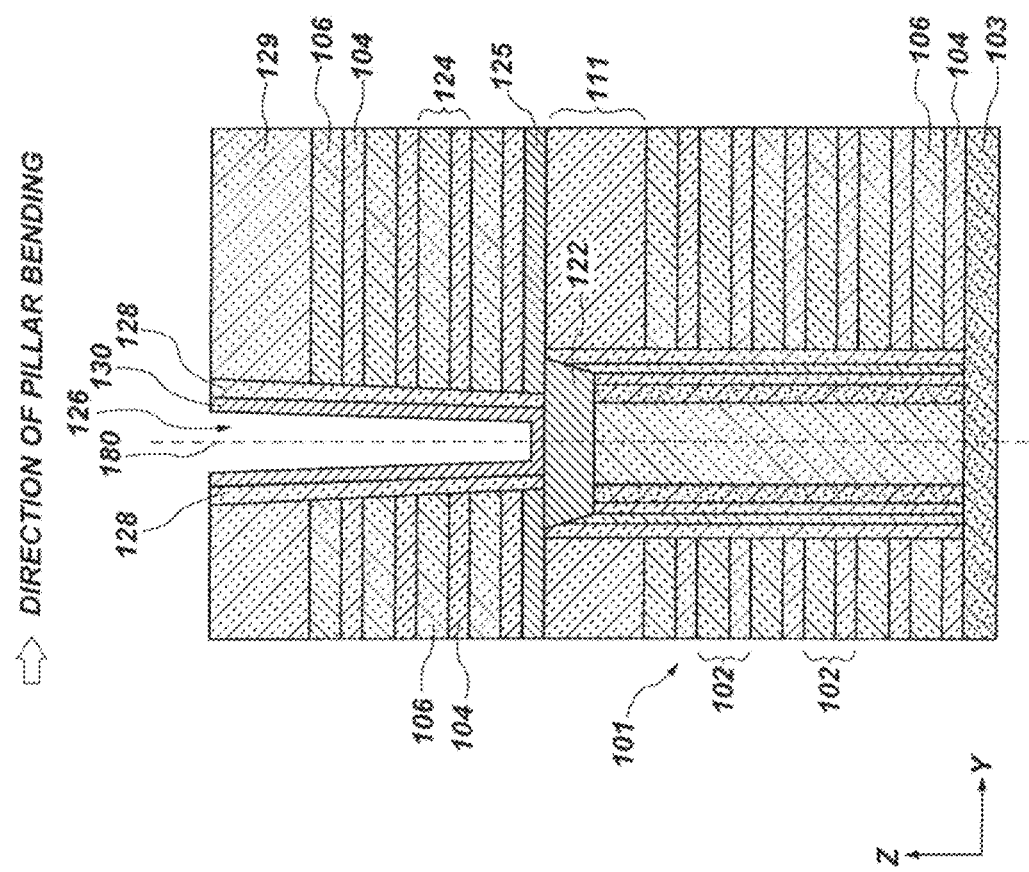
Figure 1I:
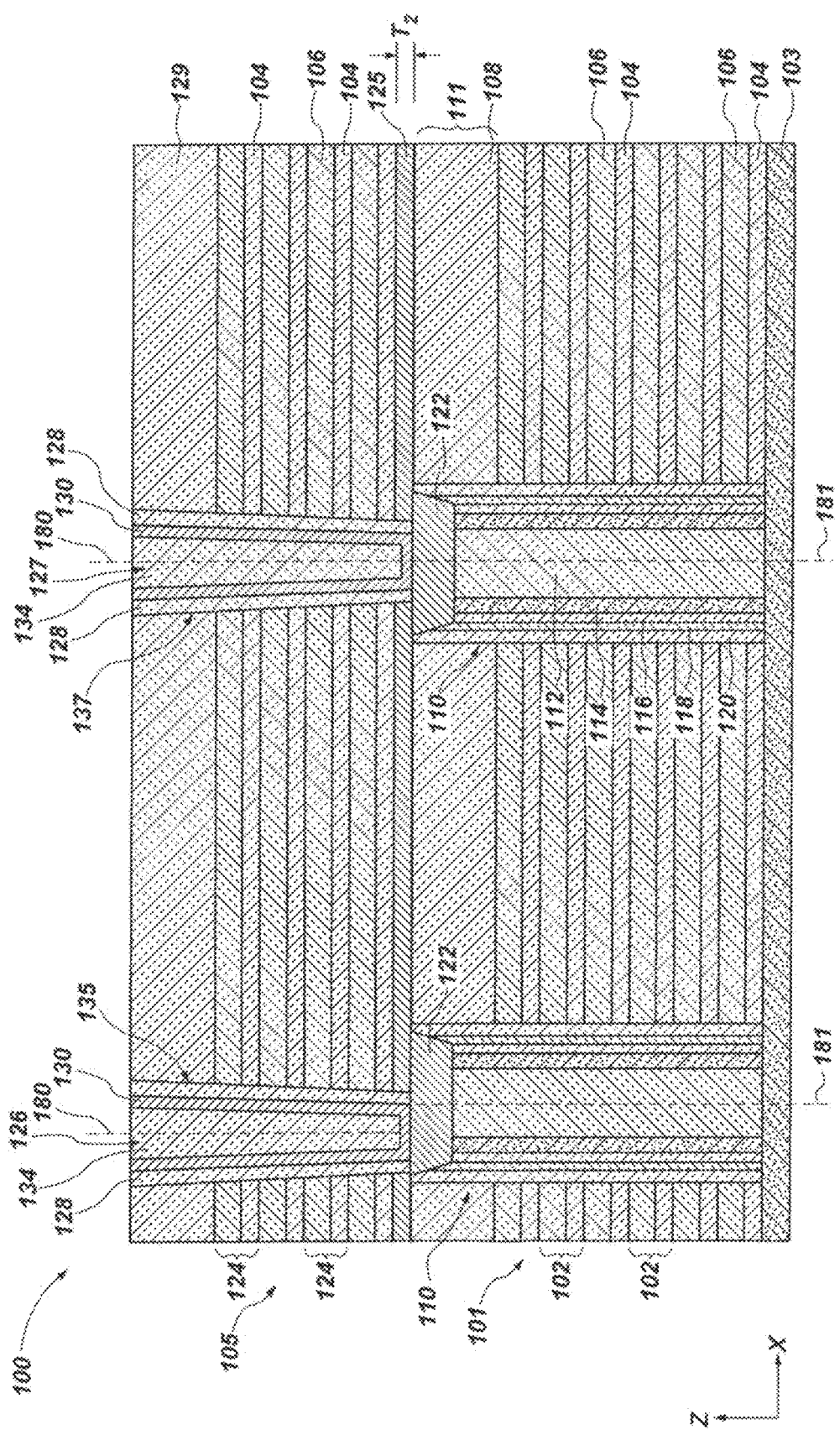
Figure 1J:
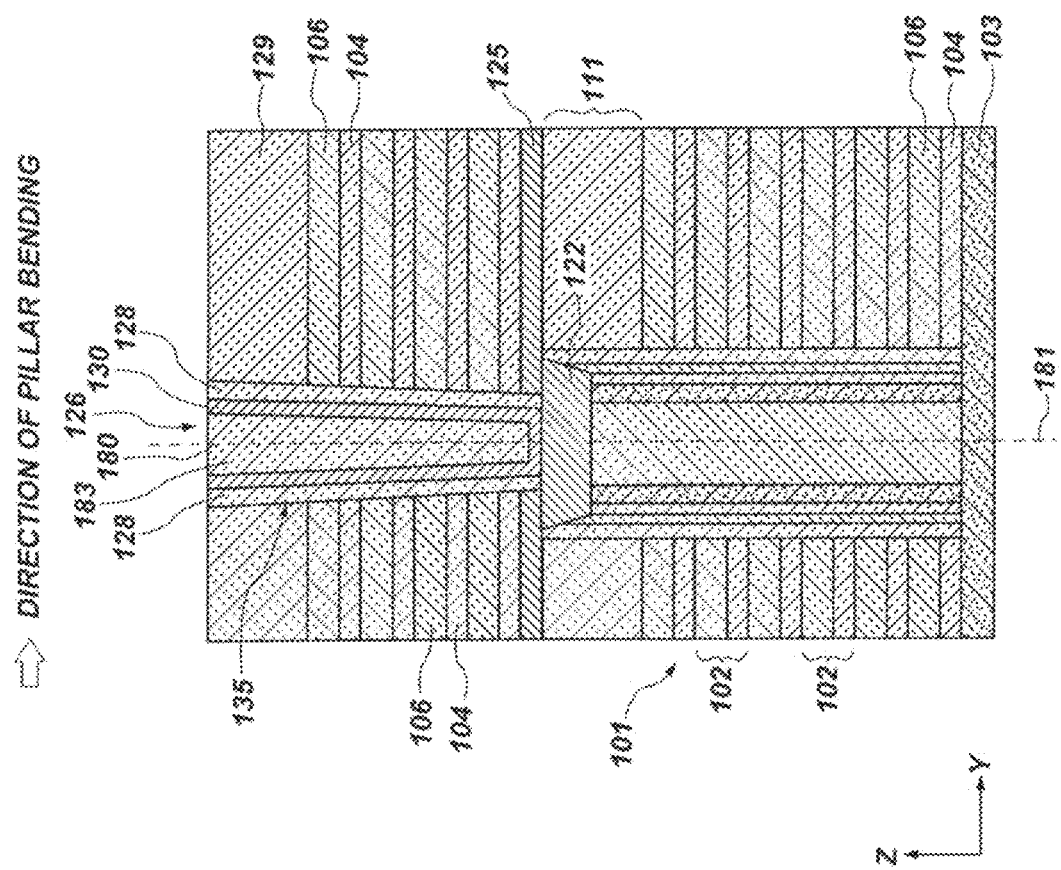
Figure 1K:
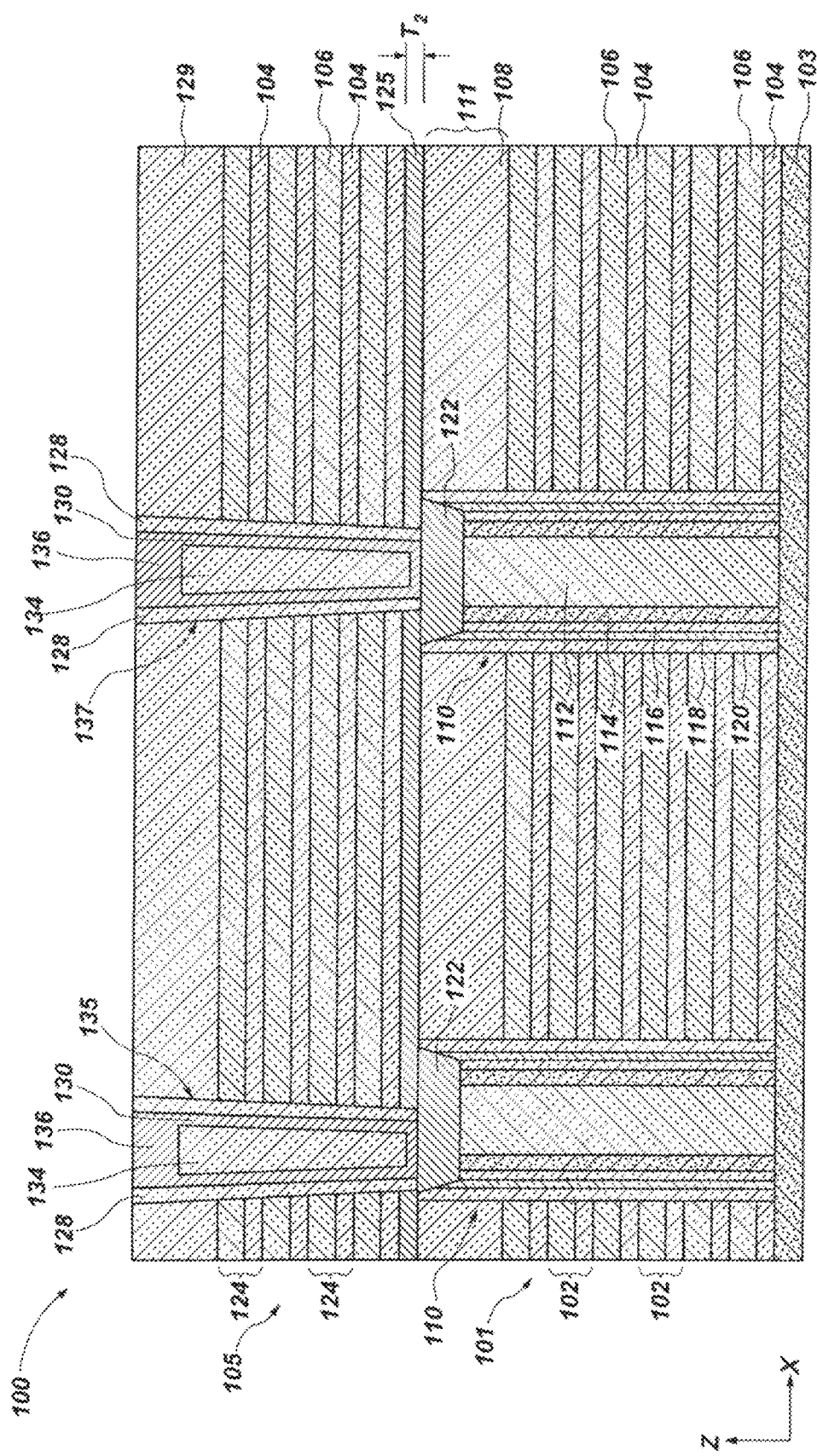
Figure 1M:
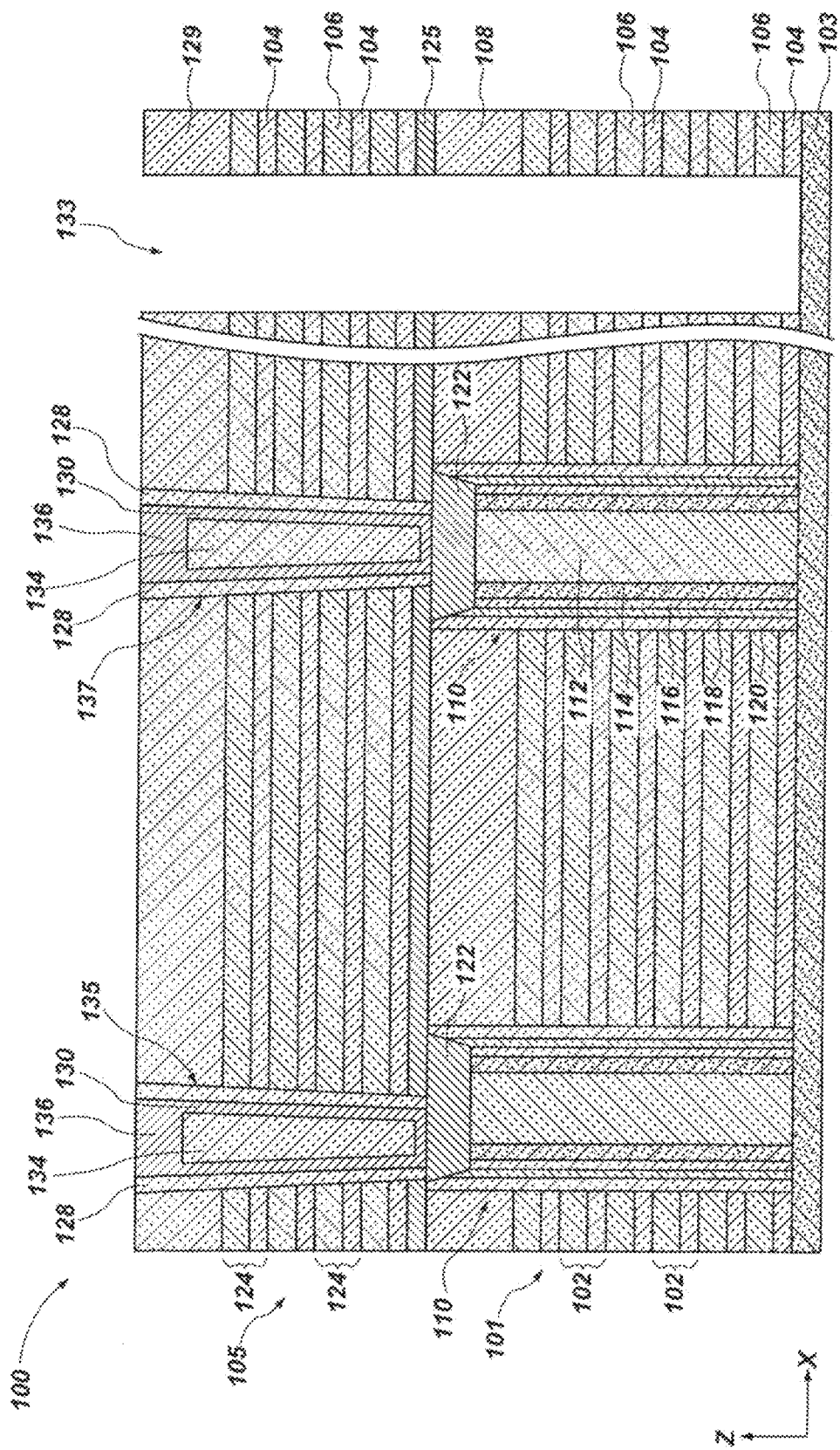
Figure 1N:
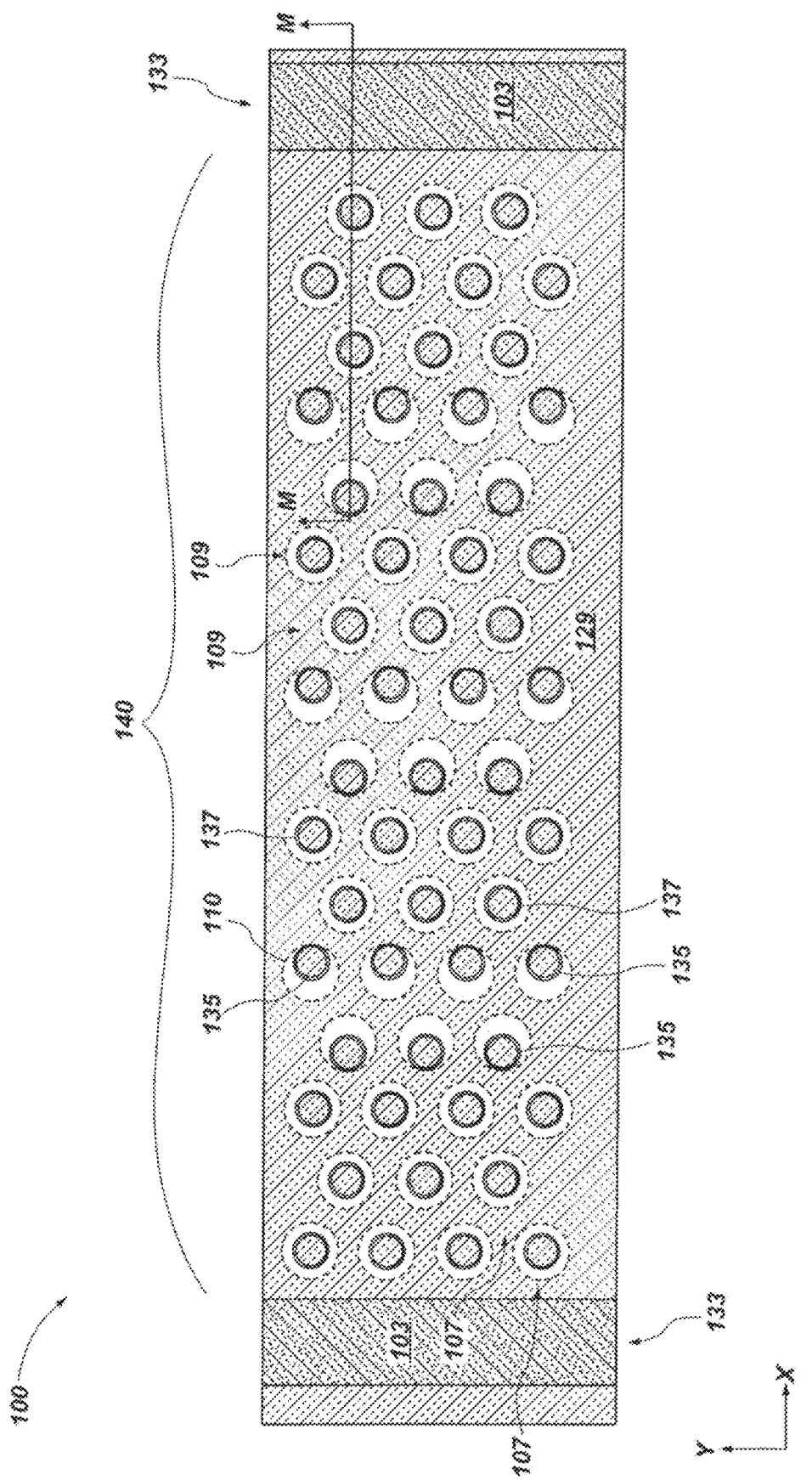
Figure 10:
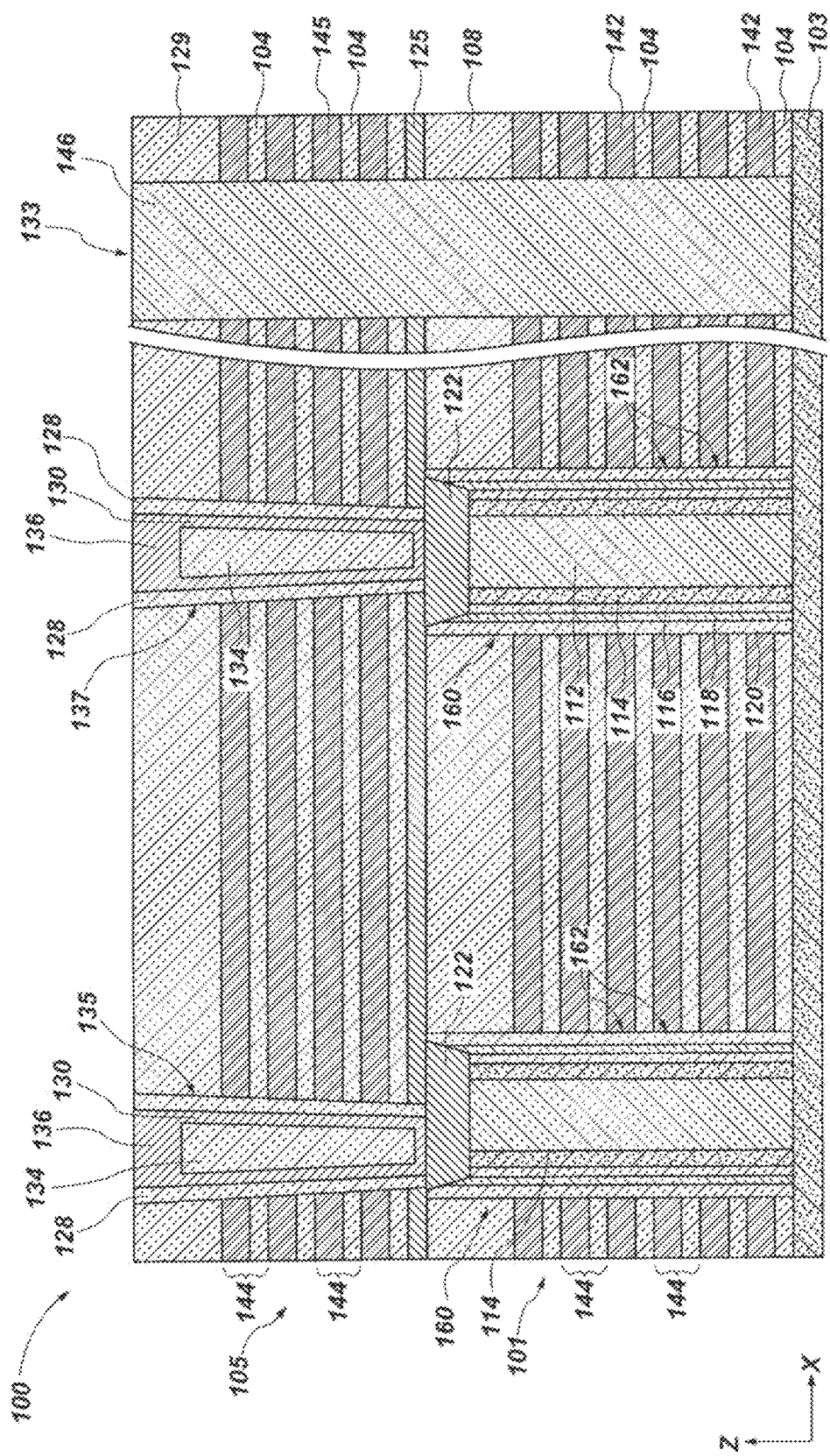
Figure 1P:
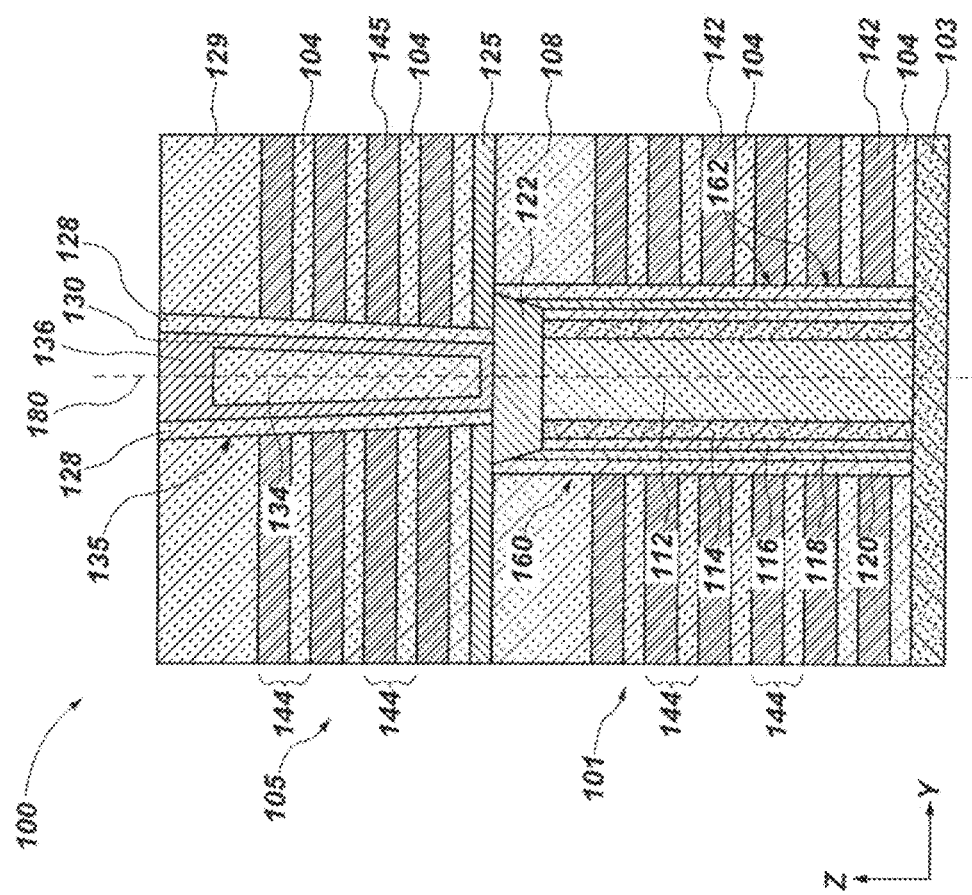
Figure 1Q:
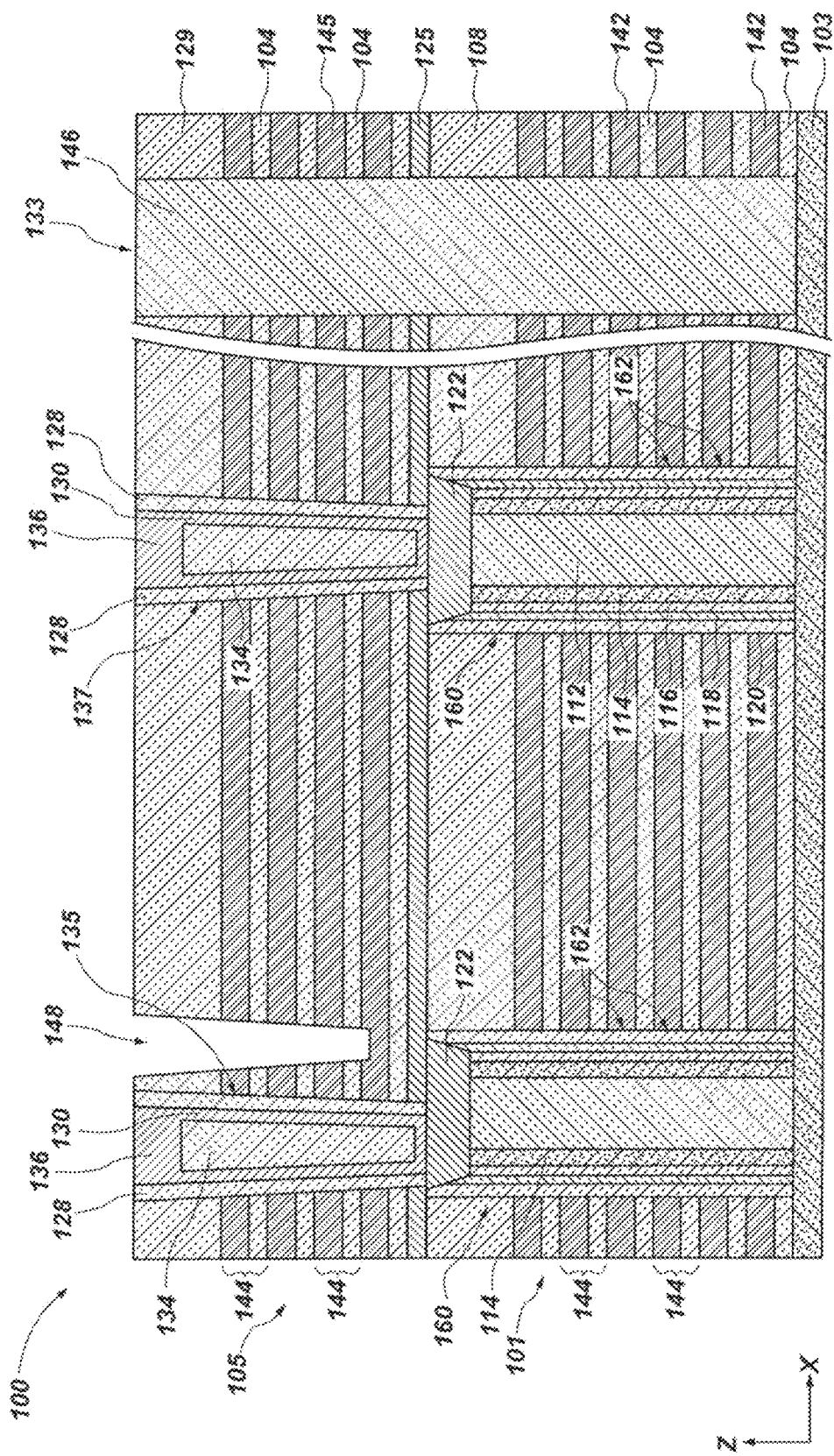
Figure 1R:
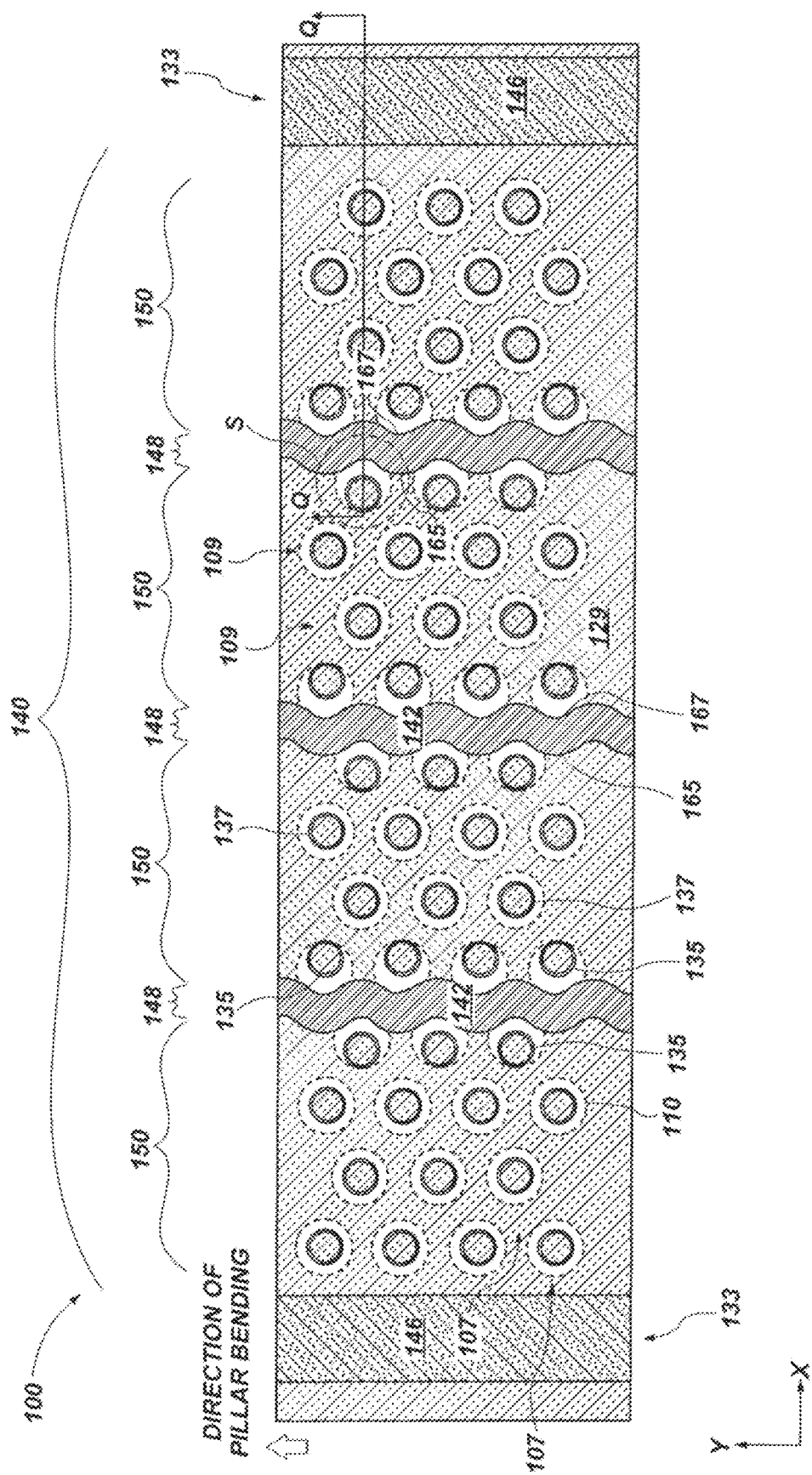
Figure 1T:
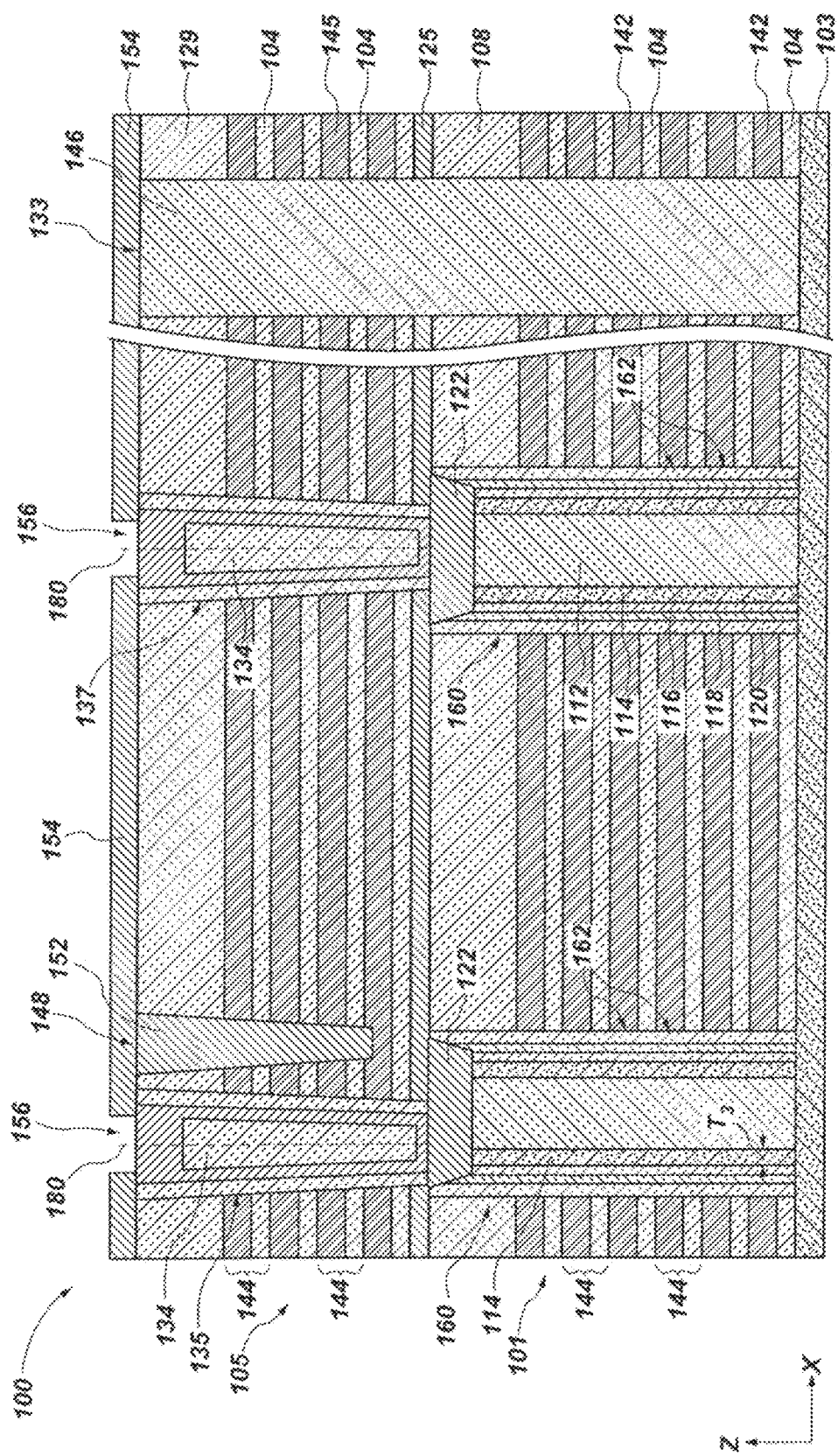
Figure 1U:
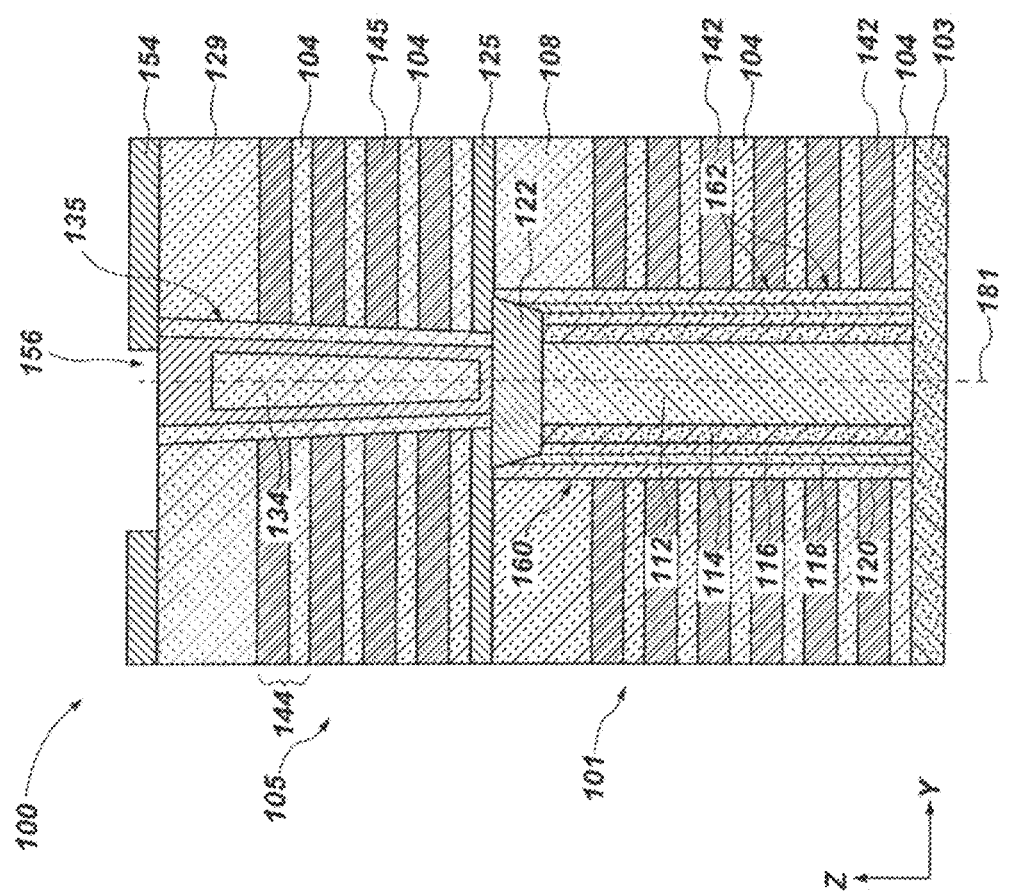
Figure 1W:
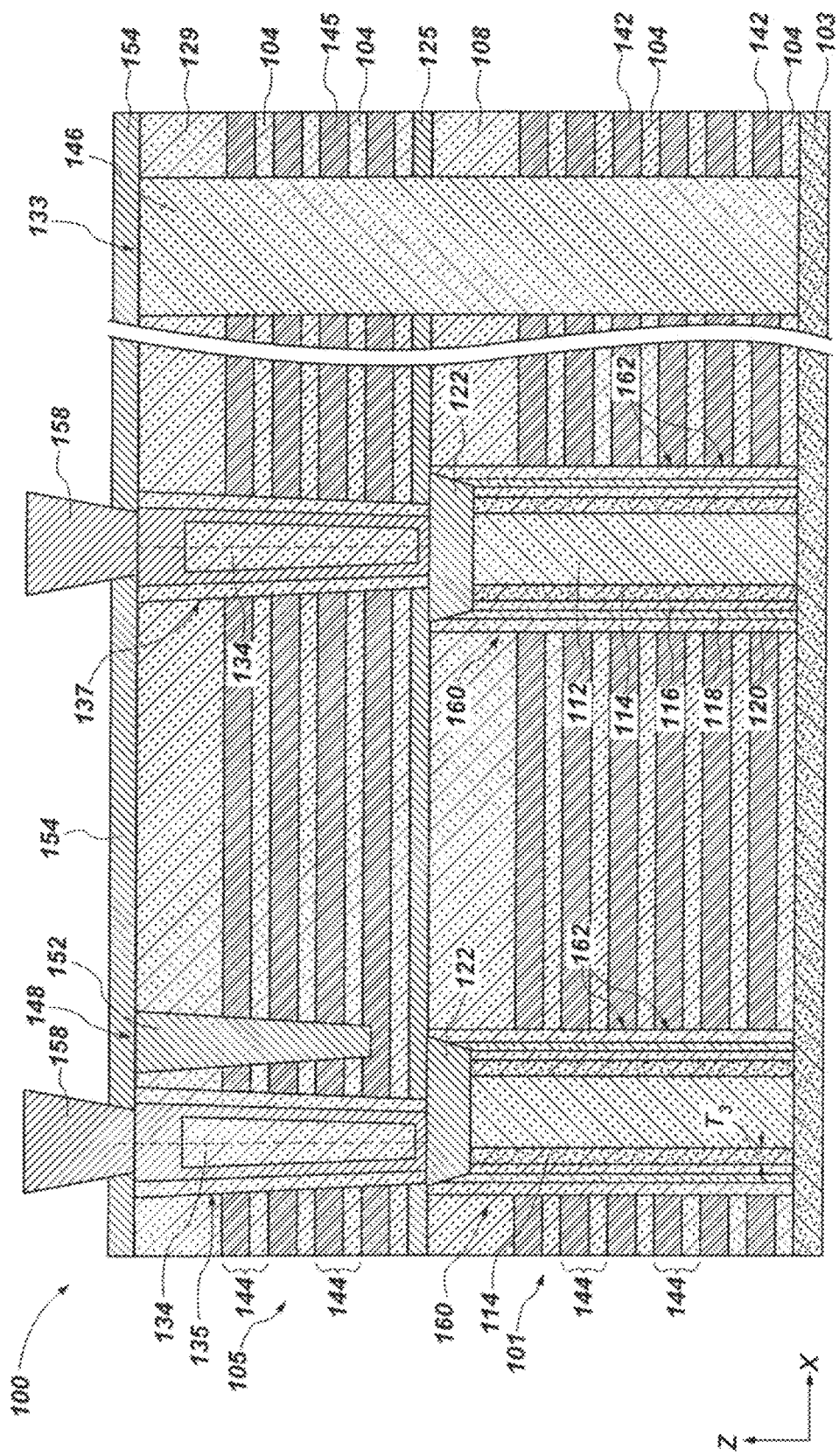
Figure 1X:
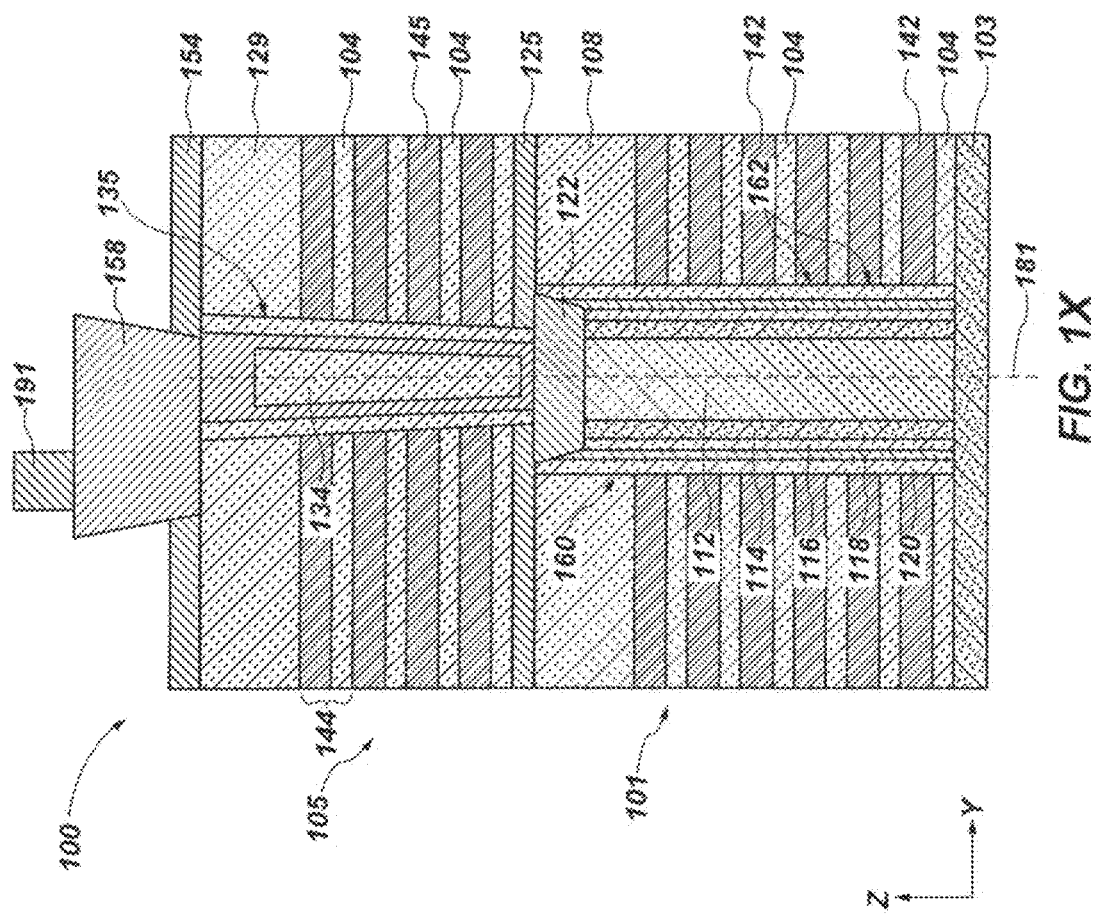

FIG. 1A-FIG. 1X illustrate a method of forming a microelectronic device structure, in accordance with embodiments of the disclosure. FIG. 1A is a simplified partial cross-sectional view of a microelectronic device structure 100, in accordance with embodiments of the disclosure. FIG. 1B is a top view of the microelectronic device structure 100 of FIG. 1A. The cross-section of FIG. 1A is taken through section line A-A of FIG. 1B. The microelectronic device structure 100 may include a stack structure 101 including a vertically (e.g., in the Z-direction) alternating sequence of insulative structures 104 and other insulative structures 106 arranged in tiers 102. Each of the tiers 102 may individually include a level of an insulative structure 104 directly vertically neighboring (e.g., adjacent) a level of the other insulative structures 106. The insulative structures 104 of the stack structure 101 may also be referred to herein as "insulative materials" and the other insulative structures 106 of the stack structure 101 may also be referred to herein as "other insulative materials."

In some embodiments, a number (e.g., quantity) of tiers 102 of the stack structure 101 may be within a range from 32 of the tiers 102 to 256 of the tiers 102. In some embodiments, the stack structure 101 includes 128 of the tiers 102. However, the disclosure is not so limited, and the stack structure 101 may include a different number of the tiers 102. In addition, in some embodiments, the stack structure 101 may include a first deck structure vertically overlying a source structure 103 and comprising tiers 102 of the insulative structures 104 and the other insulative structures 106, and a second deck structure over the first deck structure, the second deck structure comprising tiers 102 of the insulative structures 104 and the other insulative structures 106. In some such embodiments, the first deck structure may be separated from the second deck structure by an interdeck region. For example, the stack structure 101 may comprise a dual deck 3D NAND device (e.g., a 3D NAND Flash memory device). In some embodiments, the stack structure 101 may be referred to herein as a deck structure or a first deck structure.

The levels of the insulative structures 104 may be formed of and include, for example, at least one dielectric material, such as one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), and aluminum oxide ($Al_2O_3$)). In some embodiments, the insulative structures 104 are formed of and include silicon dioxide.

The levels of the other insulative structures 106 may be formed of and include an insulative material that is different than, and exhibits an etch selectivity with respect to, the insulative structures 104. In some embodiments, the other insulative structures 106 are formed of and include a nitride material (e.g., silicon nitride ($Si_3N_4$)) or an oxynitride material (e.g., silicon oxynitride). In some embodiments, the other insulative structures 106 are formed of and include silicon nitride.

The stack structure 101 may be formed over the source structure 103 (e.g., a source material, a source plate). The source structure 103 may be formed of and include, for example, a semiconductor material doped with one or more P-type conductivity materials (e.g., polysilicon doped with at least one P-type dopant, such as one or more of boron, aluminum, and gallium) or one or more N-type conductivity materials (e.g., polysilicon doped with at least one N-type dopant, such as one or more of arsenic, phosphorous, antimony, and bismuth). Although FIG. 1A has been described and illustrated as including the stack structure 101 directly over (e.g., on) the source structure 103, the disclosure is not so limited. In other embodiments, the stack structure 101 overlies a deck structure comprising additional tiers 102 of insulative structures 104 and other insulative structures 106 separated from the stack structure 101 by at least one dielectric material.

A dielectric material 108 may be located over an uppermost one of the tiers 102. The dielectric material 108 may be formed of and include an electrically insulative material, such as, for example, one or more of phosphosilicate glass (PSG), borosilicate glass (BSG), fluorosilicate glass (FSG), borophosphosilicate glass (BPSG), and silicon dioxide. In some embodiments, the dielectric material 108 may include the same material composition as the insulative structures 104. In some embodiments, the dielectric material 108 is formed of and includes silicon dioxide.

Pillars 110 (e.g., cell pillars, memory pillars) of materials may vertically extend (e.g., in the Z-direction) through the stack structure 101. As will be described herein, the materials of the pillars 110 may form memory cells (e.g., strings of memory cells). The pillars 110 (e.g., lower pillars 110) may each individually comprise an insulative material 112, a channel material 114 horizontally neighboring the insulative material 112, a tunnel dielectric material (also referred to as a "tunneling dielectric material") 116 horizontally neighboring the channel material 114, a memory material 118 horizontally neighboring the tunnel dielectric material 116, and a dielectric blocking material (also referred to as a "charge blocking material") 120 horizontally neighboring the memory material 118. The dielectric blocking material 120 may be horizontally neighboring one of the levels of other insulative structures 106 of one of the tiers 102 of the stack structure 101. The channel material 114 may be horizontally interposed between the insulative material 112 and the tunnel dielectric material 116; the tunnel dielectric material 116 may be horizontally interposed between the channel material 114 and the memory material 118; the memory material 118 may be horizontally interposed between the tunnel dielectric material 116 and the dielectric blocking material 120; and the dielectric blocking material 120 may be horizontally interposed between the memory material 118 and a level of the other insulative structure 106.

The insulative material 112 may be formed of and include an electrically insulative material such as, for example, phosphosilicate glass (PSG), borosilicate glass (BSG), fluorosilicate glass (FSG), borophosphosilicate glass (BPSG), silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), a dielectric carbon nitride material (e.g., silicon carbon nitride (SiCN)), a dielectric carboxynitride material (e.g., silicon carboxynitride (SiOCN)), or combinations thereof. In some embodiments, the insulative material 112 is formed of and includes silicon dioxide.

The channel material 114 may be formed of and include one or more of a semiconductor material (at least one elemental semiconductor material, such as polycrystalline silicon; at least one III-V compound semiconductor material, at least one II-VI compound semiconductor material, at least one organic semiconductor material, GaAs, InP, GaP, GaN, other semiconductor materials), and an oxide semiconductor material. In some embodiments, the channel material 114 includes amorphous silicon or polysilicon. In some embodiments, the channel material 114 is formed of and includes a doped semiconductor material.

The tunnel dielectric material 116 may be formed of and include a dielectric material through which charge tunneling can be performed under suitable electrical bias conditions, such as through hot-carrier injection or by Fowler-Nordheim tunneling induced charge transfer. By way of non-limiting example, the tunnel dielectric material 116 may be formed of and include one or more of silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In some embodiments, the tunnel dielectric material 116 may include silicon dioxide. In other embodiments, the tunnel dielectric material 116 is formed of and includes silicon oxynitride.

The memory material 118 may comprise a charge trapping material or a conductive material. The memory material 118 may be formed of and include one or more of silicon nitride, silicon oxynitride, polysilicon (doped polysilicon), a conductive material (tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material polycrystalline or amorphous semiconductor material including at least one elemental semiconductor element or at least one compound semiconductor material, conductive nanoparticles (e.g., ruthenium nanoparticles), or metal dots. In some embodiments, the memory material 118 is formed of and includes silicon nitride.

The dielectric blocking material 120 may be formed of and include a dielectric material such as, for example, one or more of an oxide (e.g., silicon dioxide), a nitride (silicon nitride), and an oxynitride (silicon oxynitride), or another material. In some embodiments, the dielectric blocking material 120 is formed of and includes silicon oxynitride.

In some embodiments the tunnel dielectric material 116, the memory material 118, and the dielectric blocking material 120 together may form and include a structure configured to trap a charge, such as, for example, an oxide-nitride-oxide (ONO) structure. In some such embodiments, the tunnel dielectric material 116 is formed of and includes silicon dioxide, the memory material 118 is formed of and includes silicon nitride, and the dielectric blocking material 120 is formed of and includes silicon dioxide.

Referring to FIG. 1B, some of the pillars 110 may be aligned with each other (e.g., in the Y-direction) and other of the pillars 110 may be offset from each other (e.g., in the Y-direction). The pillars 110 may be arranged in a so-called weave pattern (e.g., a hexagonal close-packed arrangement), which may facilitate an increased density of the pillars 110 (and the resulting strings of memory cells) in the stack structure 101. The pillars 110 may be arranged in rows 107 extending in a first horizontal (e.g., lateral) direction (e.g., in the X-direction) and columns 109 extending in a second horizontal direction (e.g., in the Y-direction). In some embodiments, the pillars 110 in a column 109 may be laterally offset (e.g., in each of the X-direction and the Y-direction) from pillars 110 in a neighboring (e.g., adjacent) column 109. In addition, the pillars 110 of every other column 109 may be horizontally aligned (e.g., in the Y-direction) Similarly, the pillars 110 of a row 107 may be horizontally offset (e.g., in each of the X-direction and the Y-direction) from pillars 110 in a neighboring (e.g., adjacent) row 107. In addition, the pillars 110 of every other row 107 may be horizontally aligned (e.g., in the X-direction).

With reference to FIG. 1C, after forming the pillars 110, a portion of the pillars 110 may be removed to recess the pillars 110 relative to an uppermost surface of the dielectric material 108. In some embodiments, a portion of the insulative material and the channel material 114 may be recessed vertically lower (e.g., in the Z-direction) than the other components of the pillars 110 (e.g., the tunnel dielectric material 116, the memory material 118, the dielectric blocking material 120).

In some embodiments, a conductive material 122 may be formed within the recesses to form a so-called "conductive plug structure." The conductive material 122 may be formed of and include, a polysilicon or another conductive material formulated to exhibit an etch selectivity with respect to the material of the dielectric material 108 and, in some embodiments, with respect to one or more of the materials of the pillar 110. In some embodiments, the conductive material 122 is formed of and includes polysilicon. In some embodiments, the conductive material 122 is electrically connected to (e.g., in electrical communication with) the channel material 114. In some embodiments, the conductive material 122 may include doped polysilicon. In some embodiments, the conductive material 122 is doped with one or more n-type dopants such as, for example, phosphorus. In some embodiments, the conductive material 122 is lightly doped (e.g., at a concentration of about $1\times10^{18}$ atoms/cm$^3$). Alternatively, in some embodiments, an insulative material may be formed within recesses. In such embodiments, the insulative material may be subsequently punched through to form connections with the channel material 114.

After forming the conductive material 122, the microelectronic device structure 100 may be exposed to a chemical mechanical planarization (CMP) process to remove conductive material from outside surfaces of the recesses (e.g., on an upper surface of the dielectric material 108).

Referring collectively to FIG. 1D-FIG. 1F, after forming the conductive material 122, another stack structure 105 (e.g., an upper stack structure, a select gate drain (SGD) stack structure) (which may also be referred to herein as a "second deck structure") may be formed over the stack structure 101. FIG. 1D is a simplified partial cross-sectional view of the microelectronic device structure 100 taken through section line D-D of FIG. 1E. FIG. 1E is a top view of a portion of the microelectronic device structure 100 illustrating the portion of the microelectronic device structure 100 corresponding to the location of box E of FIG. 1B. In FIG. 1E, the pillars 110 are illustrated in broken lines to indicate that they are located below an upper surface of the microelectronic device structure 100. FIG. 1F is a simplified partial cross-sectional view of the microelectronic device structure 100 taken through section line F-F of FIG. 1E. It is acknowledged that the cross-section taken through second line F-F would include a narrowed pillar 110 relative to the pillar 110 of FIG. 1D; however, the pillars 110 in FIGS. 1D and 1F are shown to be the same to better show structure of the pillars 110.

With reference to FIGS. 1D and 1F, the other stack structure 105 may include alternating levels of insulative structures 104 and the additional other insulative structures 106 formed over an etch stop material 125. The alternating levels of the insulative structures 104 and the other insulative structures 106 may be arranged in tiers 124. The dielectric material 108 between the stack structure 101 and the other stack structure 105 may be referred to as an interdeck region 111. The other stack structure 105 may include an uppermost insulative structure 129 having a greater thickness in a vertical direction (e.g., in the Z-direction) than other insulative structures 104 of the other stack structure 105.

The etch stop material 125 may be formed of and include, for example, a material exhibiting an etch selectivity with respect to the insulative structures 104 and the other insulative structures 106. In some embodiments, the etch stop material 125 may include a carbon-containing material (e.g., silicon carbon nitride (SiCN)). In some such embodiments, the etch stop material 125 may facilitate an improved electric field through a channel region proximate the etch stop material 125 during use and operation of the microelectronic device structure 100. In some embodiments, the microelectronic device structure 100 may not include the etch stop material 125 between the stack structure 101 and the other stack structure 105. In some such embodiments, the dielectric material 108 may intervene between the stack structure 101 and the other stack structure 105.

Referring specifically to FIG. 1F, due to process limitations, the stack structure 101 and the pillars 110 (e.g., the lower pillars) thereof may exhibit pillar misalignment or pillar bending such that center longitudinal axes of the pillars 110 of the microelectronic device structure 100 deviate from an ideal, true-vertical center longitudinal axis. As a non-limiting example, the pillars 110 may lean or curve away from true vertical orientations of the pillars 110. For example, a bottom portion of a given pillar 110 may be located and formed at an ideal location, but due to pillar bending, a top portion of the given pillar 110 may not be vertically aligned with the bottom surface of the pillar. In some embodiments, the stack structure 101 and the pillars 110 thereof may exhibit pillar misalignment or pillar bending in the direction indicated as "direction of pillar bending" (e.g., the Y-direction). To better show alignment, the pillars 110 of FIG. 1F are shown having true vertical orientations; however, it is understood that the pillars 110 of the microelectronic device structure 100 may exhibit the pillar misalignment or pillar bending described herein.

After forming the other stack structure 105, first openings 126 and second openings 127 (collectively referred to as openings 126, 127) may be formed through the other stack structure 105 to the conductive material 122. The first openings 126 and the second openings 127 may be formed utilizing a reticle (e.g., chrome etching on a glass plate). For example, a reticle (not shown) defining an arrangement of the first and second openings 126, 127 may be used to pattern, for example, a hardmask structure (e.g., an etch stop material) utilizing an exposure device with the arrangement of the first and second openings 126, 127, and the hardmask structure may be used to transfer (e.g., etch) the pattern of first and second openings 126, 127 through the other stack structure 105 to define the first and second openings 126, 127 in the other stack structure 105.

In some embodiments, the reticle utilized to form the first and second openings 126, 127 may include a first tailored reticle. In particular, the first tailored reticle may include a progressive reticle that is designed and fabricated based at least partially on a progression of the formation of the microelectronic device structure 100 and the elements (e.g., pillars 110) therein. For example, the first tailored reticle may include a pattern tailored (e.g., designed) to compensate for pillar misalignment and/or pillar bending exhibited within the microelectronic device structure 100 (e.g., at the interface of the stack structure 101 and the other stack structure 105) relative to true vertical pillars.

In some embodiments, the first tailored reticle may be designed and fabricated based at least partially on received data regarding the microelectronic device structure 100 (referred to herein as "structure data"). In some embodiments, the structure data may be received from a wafer testing system. For example, previously-fabricated microelectronic device structures and/or the current microelectronic device structure 100 may be tested, evaluated, and/or analyzed via conventional methods to identify pillar misalignment and/or pillar bending. As a non-limiting example, via testing and analysis, pillar misalignment and/or pillar bending may be observed in the one or more previously-fabricated microelectronic device structures and/or the current microelectronic device structure 100 during formation of the microelectronic device structure 100 described above in regard to FIGS. 1A-1C. The observed pillar misalignment and/or pillar bending may be represented in received structure data, and the first tailored reticle may be designed, fabricated, and/or otherwise provided based at least partially on the observed pillar misalignment and/or pillar bending. Furthermore, the first tailored reticle may be designed, fabricated, and/or otherwise provided to compensate for (e.g., account) the observed pillar misalignment and/or pillar bending in forming the first and second openings 126, 127. As a result, utilizing the first tailored reticle to form the first and second openings 126, 127, within which upper pillar structures 135 (FIG. 1I) are formed, may improve physical and electrical connections between elements of the other stack structure 105 and the stack structure 101 of the microelectronic device structure 100, as is described in greater detail below.

Referring still to FIGS. 1D-1F, in some embodiments, based on observed amount (e.g., degree) of pillar misalignment and/or pillar bending (e.g., misalignment and/or bending exhibited by the pillars 110 and/or conductive material relative to true vertical orientations) in the X-direction and/or the Y-direction, as represented in FIG. 1E, the pattern of the first tailored reticle may be designed, fabricated, and/or otherwise provided (e.g., adjusted relative to a reticle assuming true vertical orientations (referred to herein as an "un-tailored reticle")) in the X-direction and/or the Y-direction to account for the observed amount of pillar misalignment and/or pillar bending in forming the first and second openings 126, 127. For example, the pattern of the first tailored reticle may be adjusted relative to an un-tailored reticle (e.g., the chrome on glass ("COG") line of the reticle) by a same or similar amount as the observed pillar misalignment and/or pillar bending to account for the observed degree of pillar misalignment and/or pillar bending. As a non-limiting example, if about 55 nanometers (nm) of pillar bending in the Y-direction is observed between the stack structure 101 and the other stack structure 105 (e.g., at the interface of the stack structure 101 and the other stack structure 105), the pattern of the first tailored reticle for forming the first and second openings 126, 127 may be adjusted, relative to an un-tailored reticle, by about 55 nm in the Y-direction. While a specific amount of pillar misalignment and/or bending is described herein, the disclosure is not so limited; rather, the first tailored reticle may be designed and fabricated to compensate for an observed amount of pillar misalignment and/or pillar bending.

In some embodiments, an entirety of the pattern of the first tailored reticle may be adjusted during fabrication based on a single observed amount of pillar misalignment and/or pillar bending within the microelectronic device structure 100 as a whole. In other embodiments, each portion of the pattern of the first tailored reticle representing a block of the microelectronic device structure 100 may be adjusted individually during fabrication based on an observed amount of pillar misalignment and/or pillar bending within the pillars of a respective block of the microelectronic device structure 100. In additional embodiments, each portion of the pattern of the first tailored reticle representing a region (e.g., edge region, middle region, etc.) of the microelectronic device structure 100 may be adjusted individually during fabrication based on an observed amount of pillar misalignment and/or pillar bending within the pillars of a respective region of the microelectronic device structure 100. In yet further embodiments, each portion of the pattern of the first tailored reticle representing a first or second opening 126, 127 may be adjusted individually during fabrication based on an observed amount of pillar misalignment and/or pillar bending within a respective pillar of the microelectronic device structure 100.

In view of the foregoing, because the first tailored reticle is designed, fabricated, and/or otherwise provided based on observed pillar misalignment and/or pillar bending within the microelectronic device structure 100, the first openings 126 and the second openings 127 may be designed, fabricated, and/or otherwise provided based on observed pillar misalignment and/or pillar bending within the microelectronic device structure 100.

In some embodiments, the first tailored reticle may be formed (i.e., designed and fabricated) in real time. For example, the structure data may be received, and the first tailored reticle may be formed during the process of forming the microelectronic device structure 100. In other embodiments, tailored reticles may be formed for observed and/or expected amounts of pillar misalignment and/or pillar bending, and the first tailored reticle may be selected from the formed tailored reticles and utilized to form the first and second openings 126, 127 of the microelectronic device structure 100. For example, the first tailored reticle may be selected based on observed pillar misalignment and/or pillar bending in the structure data and/or based on an anticipated pillar misalignment and/or pillar bending within the microelectronic device structure 100.

In some embodiments, the first openings 126 and the second openings 127 may be formed via the first tailored reticle such that center axes 180 of the first openings 126 and the second openings 127 are at least substantially horizontally aligned within center axes 181 of respective conductive material 122 and/or pillar 110 at the interface of the pillars 110 and the first openings 126 and the second openings 127 in at least one direction (e.g., the Y-direction), as shown in FIG. 1F.

Additionally, in some embodiments, the center axes 180 of the first openings 126 are offset from the center axes 181 of the pillars 110 in the X-direction, and the center axes 180 of the second openings 127 are aligned with the center axes 181 of the pillars 110 in the X-direction, as shown in FIG. 1D. In other embodiments, the second openings 127 are horizontally offset from a center of the underlying pillars 110 in the X-direction, but to a lesser extent than the first openings 126. As will be described herein, the first openings 126 may neighbor (e.g., be located adjacent to) slot structures separating block structures of the microelectronic device structure 100 into one or more sub-block structures.

With reference to FIG. 1E, in some embodiments, the first openings 126 are arranged in columns 109 (e.g., extending in the Y-direction) and the second openings 127 are arranged in columns 109 horizontally neighboring the columns 109 of the first openings 126. In some such embodiments, the first openings 126 may be horizontally aligned (e.g., in the X-direction) with other first openings 126 of a same column 109 of first openings 126 and the second openings 127 may be horizontally aligned (e.g., in the X-direction) with other second openings 127 of a same column 109 of second openings 127.

After forming the first openings 126 and the second openings 127, a liner material 128 may be formed over surfaces (e.g., sidewalls) of the first openings 126 and the second openings 127. The liner material 128 may be formed of and include, for example, an insulative material, such as one or more of the materials described above with reference to the insulative material 112. In some embodiments, the liner material 128 may include silicon dioxide. After forming the liner material 128, in some embodiments, the liner material 128 may be exposed to a so-called "punch etch" to remove a portion of the liner material 128 and to expose a portion of the conductive material 122. In some embodiments, a portion of the conductive material 122 may also be removed.

Referring now to FIGS. 1G and 1H, a channel material 130 may be formed over sides of the liner material 128 and may be in electrical communication with the channel material 114 through the conductive material 122. FIG. 1G is a simplified cross-sectional view of the microelectronic device structure 100 that is from the same view point as FIG. 1D. FIG. 1H is a simplified cross-sectional view of the microelectronic device structure 100 that is from the same view point as FIG. 1F. The channel material 130 may comprise one or more of the materials described above with reference to the channel material 114. In some embodiments, the channel material 130 may include the same material composition as the channel material 114. In some embodiments, the channel material 130 may extend substantially continuously with the channel material 114. Since the channel material 130 may comprise the same material composition as the channel material 114 and the channel material 130 is in electrical communication with the channel material 114 through the conductive material 122, as used herein, the channel material 114, the conductive material 122, and the channel material 130 may be collectively referred to as a channel region.

With reference to FIGS. 1I and 1J, after forming the channel material 130, an insulative material 134 may be formed within remaining portions of the openings 126, 127 between the channel material 130 to form first upper pillar structures 135 and second upper pillar structures 137 in the respective first openings 126 and the second openings 127. FIG. 1I is a simplified cross-sectional view of the microelectronic device structure 100 that is from the same view point as FIG. 1D. FIG. 1J is a simplified cross-sectional view of the microelectronic device structure 100 that is from the same view point as FIG. 1F. The insulative material 134 may vertically overlie (e.g., in the Z-direction) the channel material 130, such as the horizontally extending portion of the channel material 130 over conductive material 122.

The insulative material 134 may be formed of and include one or more of the materials described above with reference to the insulative material 112. In some embodiments, the insulative material 134 may include substantially the same material composition as the insulative material 112. In some embodiments, the insulative material 134 may include silicon dioxide. In some embodiments, the microelectronic device structure 100 is exposed to a planarization process, such as a CMP process, after forming the insulative material 134.

In view of the foregoing, as a result of the center axes 180 of the first and second openings 126, 127 being at least substantially horizontally aligned within the center axes 181 of respective conductive material 122 and/or pillar 110 at the interface of the pillars 110 and the first and second openings 126, 127 in at least one direction (e.g., the Y-direction), the first upper pillar structures 135 and the second upper pillar structures 137 (e.g., centers of the first upper pillar structures 135 and the second upper pillar structures 137) may also be at least substantially horizontally aligned within the center axes 181 of respective conductive material 122 and/or pillar 110 at the interface of the pillars 110 and the upper pillar structures 135, 137 in at least one direction (e.g., the Y-direction), as shown in FIG. 1J.

In some embodiments, the first upper pillar structures 135 may be horizontally offset (e.g., in the X-direction) from a center of the vertically underlying (e.g., in the Z-direction) pillar 110. The second upper pillar structures 137 may be horizontally aligned with (e.g., in each of the X-direction and the Y-direction) a center of the vertically underlying (e.g., in the Z-direction) pillar 110. In some embodiments, the second upper pillar structures 137 may be horizontally offset from the center of the vertically underlying pillar 110, but to a lesser extent than the horizontal offset of the first upper pillar structures 135 from the vertically underlying pillar 110.

Referring now to FIGS. 1K and 1L, after forming the insulative material 134, at least a portion of the insulative material 134 may optionally be recessed from within the upper pillar structures 135, 137 to form a recess. FIG. 1K is a simplified cross-sectional view of the microelectronic device structure 100 that is from the same view point as FIG. 1D. FIG. 1L is a simplified cross-sectional view of the microelectronic device structure 100 that is from the same view point as FIG. 1F. The recess may be filled with additional channel material to form a horizontally extending portion 136 of the channel material 130. The additional channel material may comprise the same material composition as the channel material 130.

With collective reference to FIG. 1M and FIG. 1N, after forming the horizontally extending portion 136 of the channel material 130, slots 133 may be formed through the other stack structure 105 and the stack structure 101. FIG. 1M is a simplified partial cross-sectional view of the microelectronic device structure 100 taken through section line M-M of FIG. 1N. The slots 133 may be referred to herein as so-called "replacement gate" slots, through which the other insulative structures 106 are subsequently removed. In some embodiments, the slots 133 expose at a least a portion of the source structure 103.

Referring to FIG. 1N, the microelectronic device structure 100 may include slots 133 that are horizontally spaced from each other (e.g., in the X-direction) by a plurality of columns 109 of the pillars 110 and the upper pillar structures 135, 137. The microelectronic device structure 100 may be divided into block structures 140 between horizontally neighboring (e.g., in the X-direction) slots 133. Although FIG. 1N illustrates only one block structure 140, it will be understood that the microelectronic device structure 100 may include several block structures 140. As will be described herein, the block structures 140 may be divided into one or more sub-block structures.

Referring back to FIG. 1M, after forming the slots 133, the other insulative structures 106 of the stack structure 101 may be removed through the slots 133 as part of a so-called "replacement gate" or "gate last" process. By way of non-limiting example, the other insulative structures 106 may be removed by exposing the other insulative structures 106 to an etchant (e.g., a wet etchant) comprising one or more of phosphoric acid, sulfuric acid, hydrochloric acid, nitric acid, or another material. In some embodiments, the other insulative structures 106 are removed by exposing the other insulative structures 106 to a so-called "wet nitride strip" comprising phosphoric acid. In some embodiments, the other insulative structures 106 of the stack structure 101 and of the other stack structure 105 may be removed substantially simultaneously through the slots 133.

Referring to FIGS. 1O and 1P together, after removal of the other insulative structures 106 (FIG. 1M), conductive structures 142 may be formed between the neighboring insulative structures 104 at locations corresponding to the previous locations of the other insulative structures 106 to form a stack structure 101 comprising tiers 144 of alternating levels of the insulative structures 104 and the conductive structures 142 and another stack structure 105 comprising tiers 144 of alternating levels of the insulative structures 104 and additional conductive structures 145 (which may comprise the same material composition as the conductive structures 142). For clarity, the insulative structures 104 of the other stack structure 105 may be referred to here as additional insulative structures 104. FIG. 1O is a simplified cross-sectional view of the microelectronic device structure 100 that is from the same view point as FIG. 1M. FIG. 1P is a simplified cross-sectional view of the microelectronic device structure 100 that is from the same view point as FIG. 1L. The conductive structures 142 of the stack structure 101 may serve as local word line structures (e.g., local or word lines). The additional conductive structures 145 of the other stack structure 105 may serve as select gate structures, such as select gate drain (SGD) structures.

The conductive structures 142 and the additional conductive structures 145 may each individually be formed of and include an electrically conducive material, such as at least one electrically conductive material, such as, for example, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide (IrO$_x$), ruthenium oxide (RuO$_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the conductive structures 142 and the additional conductive structures 145 may include tungsten.

In some embodiments, the conductive structures 142 may include a conductive liner material (not shown) around the conductive structures 142, such as between the conductive structures 142 and the insulative structures 104. In addition, the additional conductive structures 145 may include a conductive liner material (not shown) around the additional conductive structures 145, such as between the additional conductive structures 145 and the insulative structures 104. The conductive liner material may comprise, for example, a seed material from which the conductive structures 142 and additional conductive structures 145 may be formed. The conductive liner material may be formed of and include, for example, a metal (e.g., titanium, tantalum), a metal nitride (e.g., tungsten nitride, titanium nitride, tantalum nitride), or another material. In some embodiments, the conductive liner material may include titanium nitride.

Formation of the conductive structures 142 may form strings 160 of memory cells 162. The memory cells 162 of the strings 160 may be located at intersections of the pillars 110 and the conductive structures 142, and may individually include a portion of one of the pillars 110 and a portion of one of the conductive structures 142. Vertically neighboring memory cells 162 of the strings 160 may be separated from each other by one of the levels of the insulative structures 104.

After forming the conductive structures 142 and the additional conductive structures 145, the slot 133 may be filled with a dielectric material 146. The dielectric material 146 may extend through the other stack structure 105 and the stack structure 101. Accordingly, the dielectric material 146 may physically separate neighboring (e.g., adjacent) block structures 140 (FIG. 1N) of the microelectronic device structure 100.

The dielectric material 146 may comprise one or more of the materials described above with reference to the insulative material 112. In some embodiments, the dielectric material 146 may include substantially the same material composition as the insulative material 112. In some embodiments, the dielectric material 146 may include silicon dioxide.

With collective reference now to FIG. 1Q-FIG. 1S, after filling the slots 133 with the dielectric material 146, additional slots 148 may be formed through the tiers 144 of alternating levels of the insulative structures 104 and the additional conductive structures 145 of the other stack structure 105. In some embodiments, the additional slots 148 are formed by sequentially removing the tiers 144 of the insulative structures 104 and the additional conductive structures 145. FIG. 1Q is a simplified partial cross-sectional view of the microelectronic device structure 100 of FIG. 1R taken through section line Q-Q. FIG. 1S is an enlarged top view of the microelectronic device structure 100 of FIG. 1R depicting the region S of FIG. 1R.

In some embodiments, the additional slots 148 terminate within a lowermost one of the tiers 144 of the other stack structure 105. In some such embodiments, the additional conductive structure 145 of the lowermost tier 144 of the other stack structure 105 may be substantially continuous within the block structure 140 and may be, for example, contiguous with the conductive structures 142 of the stack structure 101. By way of comparison, the additional slots 148 may segment the additional conductive structures 145 of the tiers 144 of the other stack structure 105 (other than the lowermost tier 144) into different portions such that the additional conductive structures 145 are not substantially continuous within the block structure 140. Rather, such additional conductive structures 145 may be segmented by the additional slots 148.

In some embodiments, the lowermost additional conductive structure 145 may comprise a so-called "dummy" word line structure. In use and operation of the microelectronic device structure 100, a voltage may be applied to the lowermost additional conductive structure 145, which may facilitate an improved current flow through the channel material 130 horizontally proximate the lowermost additional conductive structure 145 and through the interdeck region 111. The continuous lowermost additional conductive structure 145 may facilitate application of the voltage proximate substantially all of the first upper pillar structures 135 and the second upper pillar structures 137 within the block structure 140. In addition, in some embodiments, uppermost conductive structures 142 of the stack structure 101 may comprise dummy word line structures. Similarly, application of a voltage to the uppermost conductive structures 142 may facilitate improved flow of current through the channel material 130 proximate the interdeck region 111.

With continued reference to FIG. 1Q-FIG. 1S, the additional slots 148 may extend vertically over (e.g., in the Z-direction) at least a portion of each of the pillars 110 neighboring the additional slots 148. The additional slots 148 may be sized and shaped to facilitate electrical isolation of the additional conductive structures 145 and may be physically spaced from the upper pillar structures 135, 137.

The additional slots 148 may exhibit a so-called "weave" pattern wherein the additional slots 148 are not defined by a substantially straight line (e.g., extending in the Y-direction). Rather, the additional slots 148 may be configured to extend between neighboring columns of the pillars 110 and the upper pillar structures 135 and may exhibit a non-linear shape (e.g., a wave and/or sinusoidal shape) to at least partially conform to the layout (e.g., the shape) of the strings 160 of memory cells 162 and the first upper pillar structures 135. For example, the additional slots 148 may include crest region 165 (e.g., convex region) extending in a direction away from a horizontally neighboring (e.g., in the X-direction) pillar 110 and upper pillar structures 137 and may include a corresponding valley region 167 (e.g., concave region) horizontally neighboring (e.g., in the X-direction) the crest region 165.

As described above in regard to FIGS. 1D-1F, a first tailored reticle may be utilized to account and/or compensate for pillar misalignment and/or pillar bending within the microelectronic device structure 100. Likewise, formation of the additional slots 148 may be tailored and/or performed based at least partially on the observed pillar misalignment and/or pillar bending within the microelectronic device structure 100. As a non-limiting example, formation of the additional slots 148 may be tailored (e.g., shifted) based at least partially on observed pillar misalignment and/or pillar bending such that the centers 185 (FIG. 1S) of the valley regions 167 (e.g., concave region) of the additional slots 148 are at least substantially horizontally aligned in the Y-direction with center axes 187 of upper pillar structures 135 horizontally adjacent to the additional slots 148, as depicted in FIGS. 1R and 1S.

As a non-limiting example, formation of the additional slots 148 may be tailored in a manner similar to how the first tailored reticle is tailored, as described above in regard to FIGS. 1D-1F. In particular, a position of the additional slots 148 (e.g., positions of the crest regions 165 and the valley regions 167) in the Y-direction (or a direction of observed pillar misalignment and/or pillar bending) may be determined and/or designed based at least partially on the observed pillar misalignment and/or pillar bending from the structure data described above. For example, if about 55 nm of pillar bending in the Y-direction is observed at the interface of the stack structure 101 and the other stack structure 105, the position of the additional slots 148 in the Y-direction may be determined and/or designed relative to an ideal position (e.g., an ideal position where no pillar misalignment and/or pillar bending is exhibited within a microelectronic device structure) by about 55 nm in the Y-direction. For instance, positions of the crest regions 165 and valley regions 167 may be adjusted by about 55 nm in the Y-direction such that the valley regions 167 are at least substantially horizontally aligned in the Y-direction with center axes 187 of upper pillar structures 135 horizontally neighboring the additional slots 148. In some embodiments, the position of the additional slots 148 in one or more directions may be tailored by a same amount as the positions of the first and second openings 126, 127 are tailored in the one or more directions. In other embodiments, the position of the additional slots 148 in one or more directions may be tailored by a different amount than the positions of the first and second openings 126, 127 are tailored in the one or more directions. In view of the foregoing, a progressive approach may be utilized in formation of the additional slots 148 of the microelectronic device structure 100.

In view of the foregoing, a position of the additional slots 148 in one or more directions may be determined based at least partially on the observed pillar misalignment and/or pillar bending. In additional embodiments, a shape and/or pattern of the additional slots 148 (e.g., a shape of the weave pattern) within the X-Y plane (e.g., view depicted in FIG. 1R) may be determined based at least partially on the observed pillar misalignment and/or pillar bending. For example, a frequency, a wavelength, and an amplitude of the weave pattern may be determined based at least partially on the observed pillar misalignment and/or pillar bending. In further embodiments, both a position of the additional slots 148 and a shape of the additional slots 148 may be determined based at least partially on the observed pillar misalignment and/or pillar bending. Upon determination of the position and/or shape of the additional slots 148, the additional slots 148 may be formed via any conventional process.

The additional slots 148 may be located between first upper pillar structures 135 that are horizontally offset (e.g., that are not concentric) with corresponding strings 160 of memory cells 162 directly underneath the first upper pillar structures 135 (e.g., the first upper pillar structures 135 formed from the first openings 126 (FIG. 1I)). By forming the first upper pillar structures 135 neighboring (e.g., adjacent to) the additional slots 148, the additional slots 148 may be formed to have a greater horizontal dimension without being located too close or removing portions of the upper pillar structures 135. In addition, the weave pattern of the additional slots 148 and the horizontal offset of the first upper pillar structures 135 may facilitate formation of a block structure 140 having a relatively smaller horizontal dimension between slots 133 compared to conventional microelectronic devices. For example, the additional slots of a conventional microelectronic device may be formed through some (e.g., a column) of upper pillar structures, reducing the total number of upper pillar structures that can be fit within a given horizontal dimension between neighboring slots 148.

With reference to FIG. 1R, the additional slots 148 may segment the block structure 140 into sub-block structures 150, each defined within horizontal boundaries between neighboring additional slots 148.

Referring now to FIGS. 1T-1V together, after forming the additional slots 148, the additional slots 148 may be filled with a dielectric material 152. FIG. 1T is a simplified partial cross-sectional view of the microelectronic device structure 100 that is from the same view point as FIG. 1Q. FIG. 1U is another simplified partial cross-sectional view of the microelectronic device structure 100 that is from the same view point as FIG. 1P. FIG. 1V is an enlarged, partial top view of the microelectronic device structure 100 and depicts as same view point as FIG. 1S. Additionally, one or more materials and structures are represented as transparent and/or are removed within FIG. 1V to better depict an alignment of elements of the microelectronic device structure 100 in a vertical direction. The dielectric material 152 may include one or more of the materials described above with reference to the dielectric material 146. In some embodiments, the dielectric material 152 may include substantially the same material composition as the dielectric material 146. In some embodiments, the dielectric material 152 may include silicon dioxide.

After forming the dielectric material 152 within the additional slots 148, dielectric material 152 located outside of the additional slots 148 may be removed, such as by exposing the microelectronic device structure 100 to a CMP process. An etch stop material 154 (e.g., a hardmask material) may be formed over the microelectronic device structure 100. The etch stop material 154 may comprise one or more of the materials described above with reference to the etch stop material 125. In some embodiments, the etch stop material 154 may include substantially the same material composition as the etch stop material 125. In some embodiments, the etch stop material 154 may include a carbon-containing material (e.g., silicon carbon nitride (SiCN)).

With continued reference to FIGS. 1T-1V, elliptical openings 156 may be formed through the etch stop material 154 to expose an upper portion of each upper pillar structure 135, such as at least an upper surface of the horizontally extending portion 136 of the channel material 130 of the upper pillar structure 135.

Similar to the first openings 126 and the second openings 127 described above in regard to FIGS. 1D-1F, the elliptical openings 156 may be formed utilizing a reticle (e.g., a chrome etching on a glass plate). For example, a reticle (not shown) having a design for forming elliptical openings may be used to pattern, for example, the etch stop material 154 via an exposure device with the arrangement and shape of the elliptical openings 156. In other words, the reticle may be utilized to form the elliptical openings 156 through the etch stop material 154.

Furthermore, the reticle utilized to form the elliptical opening 156 may include a second tailored reticle. For example, the second reticle may include a progressive reticle that is designed and fabricated (i.e., tailored) based at least partially on a progression of the formation of the microelectronic device structure 100 and the elements (e.g., pillar 110) therein. In particular, the second tailored reticle may include a pattern tailored (e.g., designed) to compensate and/or account for pillar misalignment and/or pillar bending exhibited within the stack structure 101 and/or the other stack structure 105. For example, the second tailored reticle may include a pattern tailored to form elliptical openings that permit forming elliptical conductive contacts 158 (FIG. 1W) that contact (e.g., form an electrical connection with) both a respective upper pillar structure 135 (e.g., an upper surface of the horizontally extending portion 136 of the channel material 130 of the upper pillar structure 135) and subsequently formed access lines 191 (FIG. 1X), which have a fixed position and orientation within the microelectronic device structure 100, despite pillar misalignment and/or pillar bending exhibited by the microelectronic device structure 100. For instance, the second tailored reticle may include a pattern tailored to form elliptical openings that span a horizontal distance between uppermost surfaces of the upper pillar structures 135 and respective access lines 191 (FIG. 1X).

In some embodiments, the second tailored reticle may be tailored based at least partially on the received structure data, described above in regard to FIGS. 1D-1F. For example, as discussed above, pillar misalignment and/or pillar bending may be observed in one or more previously-fabricated microelectronic device structures and/or the current microelectronic device structure 100, and structure data representing the observed pillar misalignment and/or pillar bending may be received and utilized in tailoring the second tailored reticle. In particular, the second tailored reticle may be designed, fabricated, and/or otherwise provided based at least partially on the observed pillar misalignment and/or pillar bending. In some embodiments, the second tailored reticle may be designed, fabricated, and/or otherwise provided to form elliptical openings 156 that at least partially overlap in a vertical direction with formed upper pillar structures 135 and at least partially overlap in a vertical direction with a location of a subsequently formed access line 191 (FIG. 1X). In other words, the second tailored reticle may be designed, fabricated, and/or otherwise provided to form elliptical openings 156 to compensate and/or account for the observed pillar misalignment and/or pillar bending when forming an elliptical conductive contact 158 (FIG. 1W) between latter formed access lines 191 (FIG. 1X) of the microelectronic device structure 100 and the upper pillar structure 135 of the microelectronic device structure 100. As a result, utilizing the second tailored reticle may improve connections between the first and second upper pillar structures 135, 137 and the access lines 191 (FIG. 1X) of the microelectronic device structure 100, as is described in greater detail below.

Referring still to FIGS. 1T-1V, based on an observed amount of pillar misalignment and/or pillar bending (e.g., misalignment and/or bending exhibited by the pillars 110 relative to a perfectly-vertical orientations) in the X-direction and/or the Y-direction, the pattern of the second tailored reticle may be designed, fabricated, and/or otherwise provided. In particular, the pattern of the second tailored reticle may be designed, fabricated, and/or otherwise provided to create elliptical openings 156 having particular dimensions. For example, the major and minor axes of the ellipses defined by the elliptical openings 156 may be determined based on the observed amount of pillar misalignment and/or pillar bending. As a non-limiting example, an amount of observed pillar misalignment and/or pillar bending in the Y-direction may at least partially determine a major axis of an ellipse defined by a respective elliptical opening 156. For instance, the greater the amount of observed pillar misalignment and/or pillar bending in the Y-direction, the larger the major axis of the ellipse may become to ensure contact between the upper pillar structure 135 of the microelectronic device structure 100 and the latter formed access lines 191 (FIG. 1X) via an elliptical conductive contact 158 (FIG. 1W) formed within the respective elliptical opening 156. Likewise, an amount of observed pillar misalignment and/or pillar bending in the X-direction may at least partially determine a minor axis of the ellipse defined by the respective elliptical opening 156. For instance, the greater the amount of observed pillar misalignment and/or pillar bending in the X-direction, the larger the minor axis may become to ensure contact between the upper pillar structure 135 of the microelectronic device structure 100 and the latter formed access lines 191 (FIG. 1X) via the elliptical conductive contact 158 (FIG. 1W) formed within the respective elliptical opening 156.

In some embodiments, the major axes of the ellipses defined by the elliptical openings 156 may extend in a same direction in which word line structures (e.g., conductive structures 142, 145) of the microelectronic device structure 100 extend. For example, the major axes of the ellipses defined by the elliptical openings 156 may extend in a direction that is perpendicular to the direction in which the access line 191 (FIG. 1X) of the microelectronic device structure 100 extend. Additionally, the minor axes of the ellipses defined by the elliptical openings 156 may extend in a same direction in which access lines 191 (FIG. 1X) of the microelectronic device structure 100 extend. For example, the minor axes of the ellipses defined by the elliptical openings 156 may extend in a direction that is perpendicular to the direction in which the word line structures (e.g., conductive structures 142, 145) of the microelectronic device structure 100 extend.

In some embodiments, the second tailored reticle may be formed (i.e., designed and fabricated) in real time. For example, the structure data may be received, and the second tailored reticle may be formed during the process of forming the microelectronic device structure 100. In other embodiments, tailored reticles may be formed for observed and/or typical amounts of pillar misalignment and/or pillar bending, and the second tailored reticle may be selected from the formed tailored reticles and utilized to form the elliptical openings 156 of the microelectronic device structure 100.

For example, the second tailored reticle may be selected based on observed pillar misalignment and/or pillar bending in the structure data and/or based on an anticipated pillar misalignment and/or pillar bending within the microelectronic device structure 100.

In some embodiments, centers of the ellipses defined by the elliptical openings 156 may be offset from the center axes of both the pillar 110 and the upper pillar structure 135 in one or more of the Y-direction and the X-direction. Additionally, the centers of the ellipses defined by the elliptical openings 156 may be offset from an ideal center axes of both the pillars 110 and the upper pillar structures 135 in one or more of the Y-direction and the X-direction.

Referring now to FIGS. 1W and 1X, after forming the elliptical openings 156, elliptical conductive contacts 158 (e.g., elliptical conductive contacts 158 having elliptical cross-sections within the X-Y plane) may be formed over and in electrical communication with the channel material 130 and at least partially within the elliptical openings 156. As noted above, the elliptical conductive contacts 158 may be electrically coupled to access lines 191 (e.g., bit lines) (FIG. 1X) configured for selectively coupling to strings 160 of memory cells 162. Additionally, the elliptical conductive contacts 158 may at least partially be formed within the elliptical openings 156, and therefore, the elliptical conductive contacts 158 may have elliptical cross-sections within the X-Y plane.

The elliptical conductive contacts 158 may comprise an electrically conductive material, such as one or more of the materials described above with reference to the conductive structures 142. In some embodiments, the elliptical conductive contacts 158 may include substantially the same material composition as the conductive structures 142. In some embodiments, the elliptical conductive contacts 158 may include tungsten.

Referring to FIGS. 1A-1X together, utilizing the first tailored reticle to form the first and second openings 126, 127 based on observed pillar misalignment and/or pillar bending, tailoring the additional slots 148 based on observed pillar misalignment and/or pillar bending, and utilizing the second tailored reticle to form the elliptical openings 156 based on observed pillar misalignment and/or pillar bending may be advantageous over conventional methods for forming microelectronic device structure 100. For example, in comparison to conventional methods and structures exhibiting pillar misalignment and/or pillar bending, utilizing the first tailored reticle to form the first and second openings 126, 127 based on observed pillar misalignment and/or pillar bending may improve overlap between the pillars 110 and the upper pillar structures 135. As a result, an electrical connection between the pillars 110 and the upper pillar structures 135 may be improved.

Additionally, in comparison to conventional methods and structures exhibiting pillar misalignment and/or pillar bending, tailoring the additional slots 148 based on observed pillar misalignment and/or pillar bending may reduce interference between the additional slots 148 and the upper pillar structures 135. Furthermore, tailoring the additional slots 148 based on observed pillar misalignment and/or pillar bending may improve orientation of the additional slots 148 relative to the upper pillar structures 135.

Furthermore, in comparison to conventional methods and structures exhibiting pillar misalignment and/or pillar bending, utilizing the second tailored reticle to form the elliptical openings 156 based on observed pillar misalignment and/or pillar bending may improve overlap between the elliptical conductive contacts 158 and the upper pillar structures 135 and thus, may improve electrical connections between the elliptical conductive contacts 158 and the upper pillar structures 135. Additionally, utilizing the second tailored reticle to form the elliptical openings 156 based on observed pillar misalignment and/or pillar bending may improve overlap between the elliptical conductive contacts 158 and the access lines 191 (e.g., bit lines), which have a fixed location within the microelectronic device structure 100, even when the microelectronic device structure 100 exhibits pillar misalignment and/or pillar bending. For example, the elliptical shape of the elliptical openings 156 and the elliptical conductive contacts 158 relative to a circular shape and the offset position of the elliptical openings 156 relative to the upper pillar structures 135 (e.g., in the Y-direction (i.e., the direction of pillar bending)) improves overlap between the elliptical conductive contacts 158 and the access lines 191 (e.g., bit lines).

Referring still to FIGS. 1A-1X together, by improving overlap between the pillars 110 and the upper pillar structures 135 utilizing the first tailored reticle, improving overlap between the elliptical conductive contacts 158 and the upper pillar structures 135, and improving overlap between the elliptical conductive contacts 158 and the access lines 191, the methods and embodiments described herein may reduce a dummy pillar area of the microelectronic device structure 100 in comparison to convention methods and structures. In particular, dummy pillars are typically included within microelectronic device structure 100 to mitigate or reduce pillar bending. Therefore, because pillar bending is accommodated in the embodiments described herein, the dummy pillar areas of the microelectronic device structure 100 may be substantially reduced or eliminated. As a non-limiting example, in a microelectronic device structure exhibiting 55 nm of pillar bending, a dummy pillar area may be reduced to about 5 μm. Reducing the dummy pillar area of the microelectronic device structure 100 may also improve array efficiency and yield a more competitive (e.g., smaller) microelectronic device structure (e.g., die) size.

Additionally, because the above-described improvements are achieved via tailored reticles, the methods and embodiments described herein may be achieved with minimal additional cost relative to conventional methods and structures. Furthermore, the elliptical shape of the elliptical conductive contacts 158 is verifiable and detectable via conventional microelectronic device structure testing and analysis methods.

Furthermore, the additional slots 148 having the "weave" pattern and the horizontal offset of the first upper pillar structures 135 in the X-direction may facilitate improved operation of the microelectronic device structure 100. For example, the select gate structures formed from the additional conductive structures 145 may exhibit improved threshold voltage properties compared to conventional microelectronic devices. In addition, since the additional conductive structures 145 are formed through the slots 133 (rather than through the additional slots 148), the additional conductive structures 145 may be formed to exhibit improved electrical properties compared to additional conductive structures 145 of conventional microelectronic device structures. Further, since the additional slots 148 are formed through the other stack structure 105 comprising tiers 144 of the additional conductive structures 145 and the other insulative structures 104 (rather than through a stack structure comprising polysilicon or another sacrificial material, as in conventional microelectronic device structures), the additional conductive structures 145 may exhibit fewer voids (e.g., tungsten voids), resulting in improved electrical conductivity (and a lower electrical resistance) compared to conventional microelectronic device structures.

Although FIG. 1A through FIG. 1X have been described and illustrated as including memory cells 162 having a particular structure and configuration, the disclosure is not so limited. In some embodiments, the memory cells 162 may comprise so-called "MONOS" (metal-oxide-nitride-oxide-semiconductor) memory cells. In additional embodiments, the memory cells 162 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In other embodiments, the memory cells 162 comprise so-called "floating gate" memory cells including floating gates (e.g., metallic floating gates) as charge storage structures. The floating gates may horizontally intervene between central structures of the strings 160 and the conductive structures 142.

In some embodiments, electrical connection of the channel material 114 to the channel material 130 by the conductive material 122 may facilitate improved performance of the microelectronic device structure 100. For example, current flow between the channel material 114 and the channel material 130 may be enhanced by the conductive material 122 since the current may flow along several paths through the conductive material 122 between the channel material 114 and the channel material 130 (due to the size and shape of the conductive material 122). In addition, a concentration of dopants within the conductive material 122 may be controlled to facilitate improved flow of current between the channel material 114 and the channel material 130.

Figure 2:
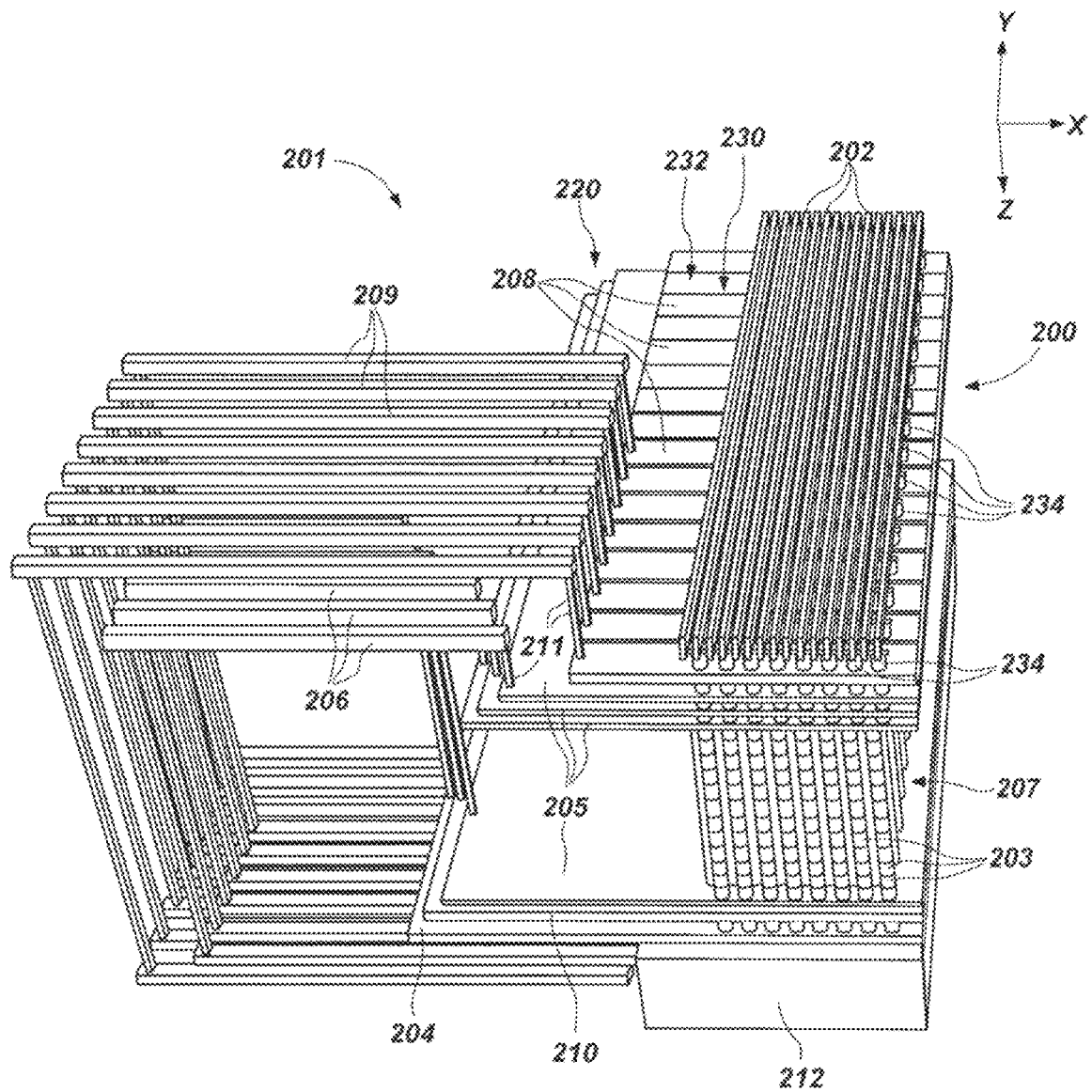
FIG. 2 is a partial cutaway perspective view of a microelectronic device, in accordance with embodiments of the disclosure.

FIG. 2 illustrates a partial cutaway perspective view of a portion of a microelectronic device 201 (e.g., a memory device, such as a dual deck 3D NAND Flash memory device) including a microelectronic device structure 200. The microelectronic device structure 200 may be substantially similar to the microelectronic device structure 100 following the processing stage previously described with reference to FIGS. 1W and 1X. As shown in FIG. 2, the microelectronic device structure 200 may include a staircase structure 220 defining contact regions for connecting access lines 206 to conductive tiers 205 (e.g., conductive layers, conductive plates, such as the conductive structures 142 (FIGS. 1W and 1X)). The microelectronic device structure 200 may include vertical strings 207 (e.g., strings 160 (FIGS. 1W and 1X)) of memory cells 203 (e.g., memory cells 162 (FIGS. 1W and 1X)) that are coupled to each other in series. The vertical strings 207 may extend vertically (e.g., in the Z-direction) and orthogonally to conductive lines and conductive tiers 205, such as data lines 202, a source tier 204 (e.g., the source structure 103 (FIGS. 1W and 1X)), the conductive tiers 205, the access lines 206, first select gates 208 (e.g., upper select gates, drain select gates (SGDs), such as the additional conductive structures 145 (FIG. 1O) of the other stack structure 105 (FIGS. 1W and 1X)), select lines 209, and a second select gate 210 (e.g., a lower select gate, a source select gate (SGS)). The select gates 208 may be horizontally divided (e.g., in the Y-direction) into multiple blocks 232 (e.g., block structures 140 (FIG. 1R)) horizontally separated (e.g., in the Y-direction) from one another by slots 230 (e.g., the dielectric material 146 (FIG. 1Q, FIG. 1R) formed within the slot 133 (FIG. 1Q, FIG. 1R) and the dielectric material 152 (FIGS. 1W and 1X) of the additional slots 148 (FIGS. 1W and 1X)). As described above, with reference to the microelectronic device structure 100, the size, shape, and orientation of the additional slots 148 relative to the first upper pillar structures 135 (FIGS. 1W and 1X) and the elliptical conductive contacts 158 (FIGS. 1W and 1X) may facilitate formation of first select gates 208 exhibiting a relatively improved properties.

Vertical conductive contacts 211 may electrically couple components to each other as shown. For example, the select lines 209 may be electrically coupled to the first select gates 208 and the access lines 206 may be electrically coupled to the conductive tiers 205. The microelectronic device 201 may also include a control unit 212 positioned under the memory array, which may include control logic devices configured to control various operations of other features (e.g., the vertical strings 207 of memory cells 203) of the microelectronic device 201. By way of non-limiting example, the control unit 212 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control unit 212 may be electrically coupled to the data lines 202, the source tier 204, the access lines 206, the first select gates 208, and the second select gates 210, for example. In some embodiments, the control unit 212 includes CMOS (complementary metal-oxide-semiconductor) circuitry. In such embodiments, the control unit 212 may be characterized as having a "CMOS under Array" ("CuA") configuration.

The first select gates 208 may extend horizontally in a first direction (e.g., the X-direction) and may be coupled to respective first groups of vertical strings 207 of memory cells 203 at a first end (e.g., an upper end) of the vertical strings 207. The second select gate 210 may be formed in a substantially planar configuration and may be coupled to the vertical strings 207 at a second, opposite end (e.g., a lower end) of the vertical strings 207 of memory cells 203.

The data lines 202 (e.g., bit lines) may extend horizontally in a second direction (e.g., in the Y-direction) that is at an angle (e.g., perpendicular) to the first direction in which the first select gates 208 extend. The data lines 202 may be coupled to respective second groups of the vertical strings 207 at the first end (e.g., the upper end) of the vertical strings 207. A first group of vertical strings 207 coupled to a respective first select gate 208 may share a particular vertical string 207 with a second group of vertical strings 207 coupled to a respective data line 202. Thus, a particular vertical string 207 may be selected at an intersection of a particular first select gate 208 and a particular data line 202. Accordingly, the first select gates 208 may be used for selecting memory cells 203 of the vertical strings 207 of memory cells 203.

The conductive tiers 205 (e.g., word lines, word line plates, such as the conductive structures 142 (FIG. 1P)) may extend in respective horizontal planes. The conductive tiers 205 may be stacked vertically, such that each conductive tier 205 is coupled to all of the vertical strings 207 of memory cells 203, and the vertical strings 207 of the memory cells 203 extend vertically through the stack of conductive tiers 205. The conductive tiers 205 may be coupled to or may form control gates of the memory cells 203 to which the conductive tiers 205 are coupled. Each conductive tier 205 may be coupled to one memory cell 203 of a particular vertical string 207 of memory cells 203.

The first select gates 208 and the second select gates 210 may operate to select a particular vertical string 207 of the memory cells 203 between a particular data line 202 and the source tier 204. Thus, a particular memory cell 203 may be selected and electrically coupled to a data line 202 by operation of (e.g., by selecting) the appropriate first select gate 208, second select gate 210, and conductive tier 205 that are coupled to the particular memory cell 203.

The staircase structure 220 may be configured to provide electrical connection between the access lines 206 and the conductive tiers 205 through the vertical conductive contacts 211. In other words, a particular level of the conductive tiers 205 may be selected via an access line 206 in electrical communication with a respective vertical conductive contact 211 in electrical communication with the particular conductive tier 205.

The data lines 202 may be electrically coupled to the vertical strings 207 through conductive contact structure 234 (e.g., the conductive contacts (FIG. 1X)).

Figure 3:
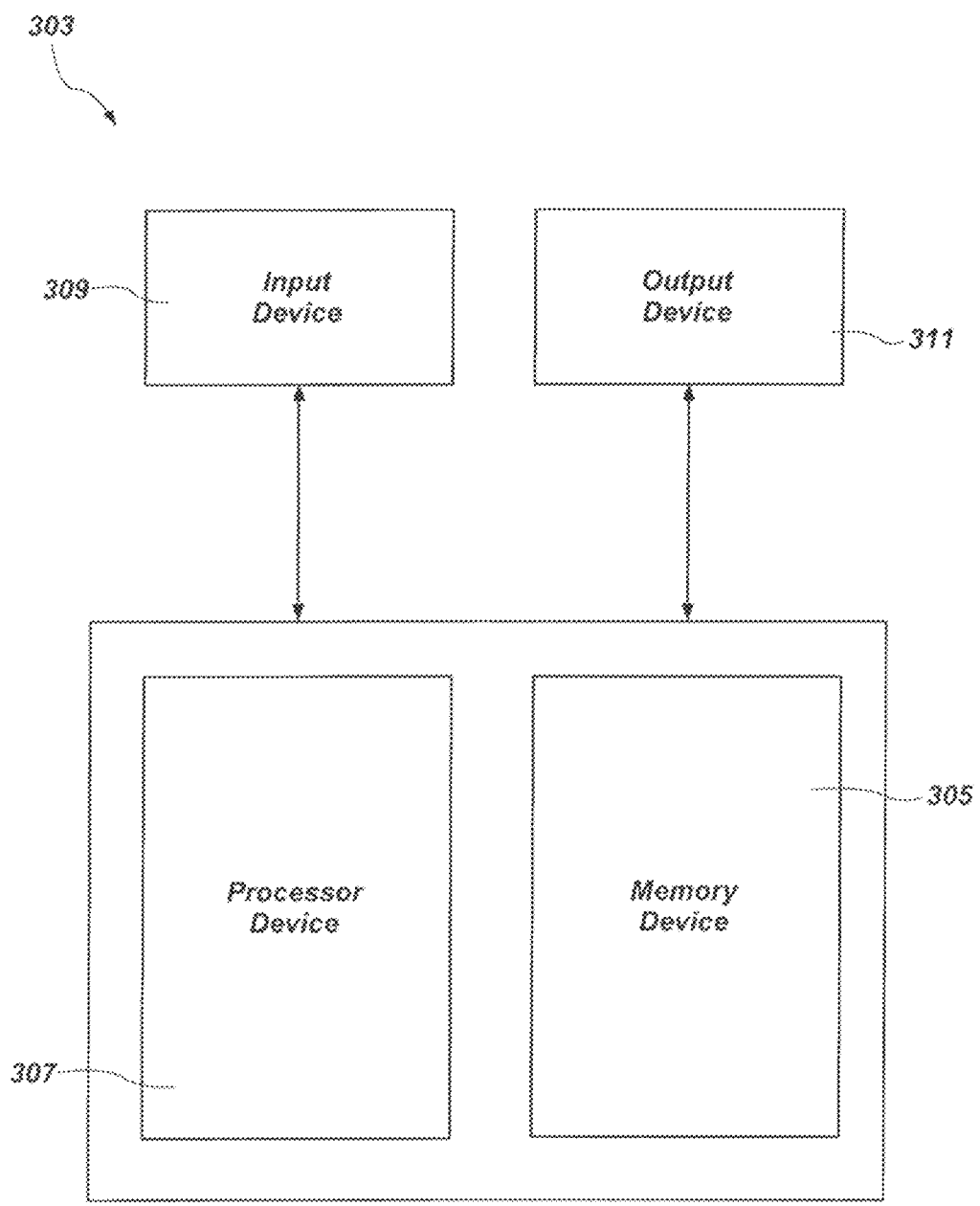
FIG. 3 is a block diagram of an electronic system, in accordance with embodiments of the disclosure.

Microelectronic devices including microelectronic devices (e.g., the microelectronic device 201) and microelectronic device structures (e.g., the microelectronic device structures 100, 200) including the upper pillar structures 135, 137 being formed via tailored reticles, the additional slots 148 exhibiting a weave pattern, and the elliptical conductive contacts 158 being formed via tailored reticles may be used in embodiments of electronic systems of the disclosure. For example, FIG. 3 is a block diagram of an electronic system 303, in accordance with embodiments of the disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of a microelectronic device structure previously described herein (e.g., the microelectronic device structure 100, 200) or a microelectronic device (e.g., the microelectronic device 201), previously described with reference to FIG. 1A through FIG. 1X and FIG. 2, including the additional slots 148, the first upper pillar structures 135 and second upper pillar structures 137, and the elliptical conductive contacts 158.

The electronic system 303 may further include at least one electronic signal processor device 307 (often referred to as a "microprocessor"). The electronic signal processor device 307 may, optionally, include an embodiment of a microelectronic device or a microelectronic device structure previously described herein (e.g., one or more of the microelectronic device 201 or the microelectronic device structure 100, 200 previously described with reference to FIG. 1A through FIG. 1P and FIG. 2). The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Figure 4:
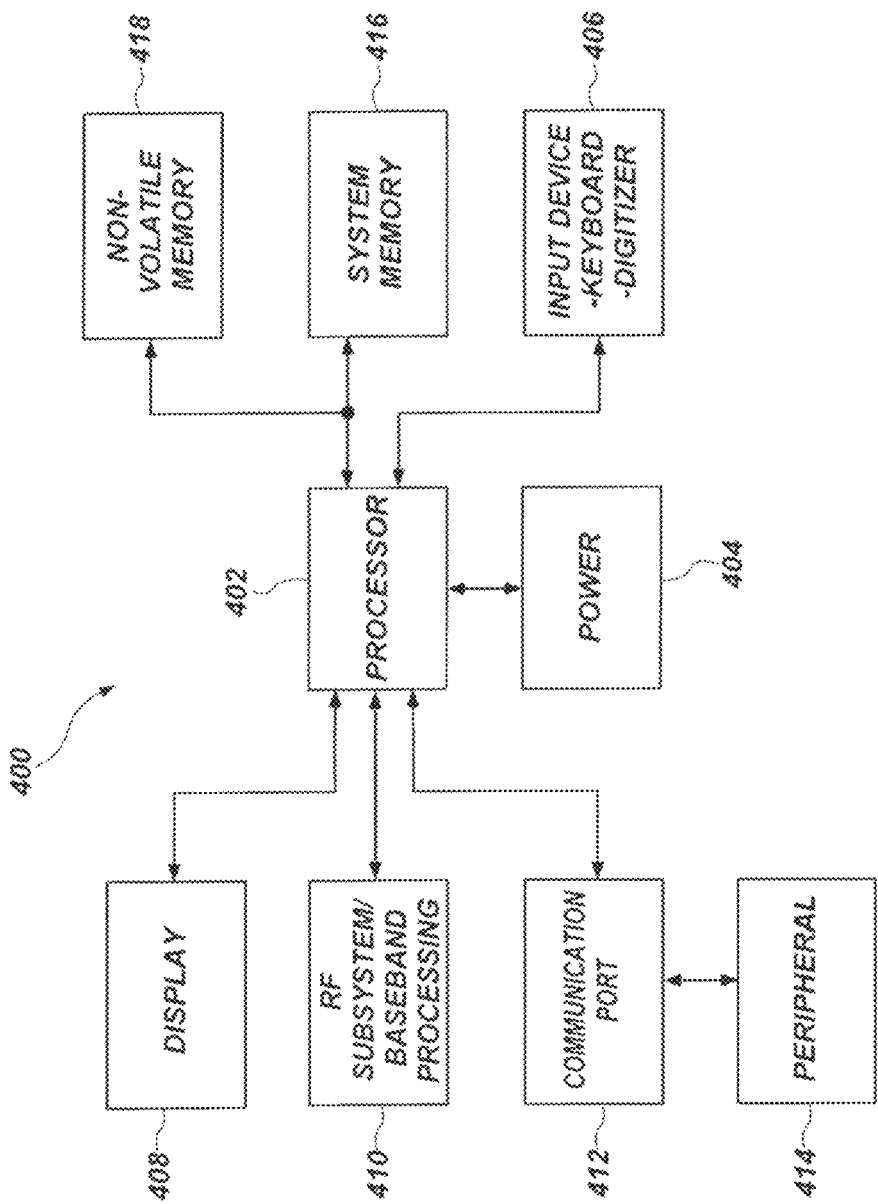
FIG. 4 is a block diagram of a processor-based system, in accordance with embodiments of the disclosure.

With reference to FIG. 4, depicted is a processor-based system 400. The processor-based system 400 may include various microelectronic devices and microelectronic device structures (e.g., microelectronic devices and microelectronic device structures including one or more of the microelectronic device 201 or the microelectronic device structure 100, 200) manufactured in accordance with embodiments of the present disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include microelectronic devices and microelectronic device structures (e.g., microelectronic devices and microelectronic device structures including one or more of the microelectronic device 201 or the microelectronic device structure 100, 200) manufactured in accordance with embodiments of the present disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF subsystem/baseband processor 410 may also be coupled to the processor 402. The RF subsystem/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as the microelectronic devices and microelectronic device structures (e.g., the microelectronic device 201 and the microelectronic device structure 100, 200) described above, or a combination thereof.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include microelectronic devices, such as the microelectronic devices and microelectronic device structures (e.g., the microelectronic device 201 and the microelectronic device structure 100, 200) described above, or a combination thereof.

Thus, in accordance with embodiments of the disclosure an electronic system comprises an input device, an output device, a processor device operably coupled to the input device and the output device, and a memory device operably coupled to the processor device and comprising at least one microelectronic device. The at least one microelectronic device comprises strings of memory cells extending through a stack structure comprising alternating levels of insulative structures and conductive structures, the strings of memory cells exhibiting pillar bending in a first direction, upper pillars within an additional stack structure comprising alternating levels of additional insulative structures and additional conductive structures, centers of lowermost surfaces of the upper pillars being substantially aligned with respective centers of uppermost surfaces of the strings of memory cells in the first direction, slot structures extending at least partially through the stack structure, the slot structures individually exhibiting a non-linear shape, elliptical conductive contacts contacting uppermost surfaces of the upper pillars, ellipse cross-sections of the elliptical conductive contacts have major axes extending in the first direction, and access lines in electrical contact with the elliptical conductive contacts and extending in a second direction perpendicular to the first direction.

Embodiments of the disclosure include methods of forming a microelectronic device. The methods include forming a first stack structure comprising alternating levels of insulative structures and other insulative structures, forming strings of memory cells comprising a channel material extending through the first stack structure, forming a second stack structure comprising alternating levels of additional insulative structures and additional other insulative structures over the first stack structure, based at least partially on an observed amount of pillar bending within the first stack structure, forming a first tailored reticle specific to the observed amount of pillar bending, utilizing the first tailored reticle to form openings extending through the second stack structure and over some of the strings of memory cells, wherein centers of the openings over the strings of memory cells are at least substantially aligned with the centers of uppermost surfaces of the strings of memory cells in a direction of the observed pillar bending, forming upper pillars extending through the second stack structure and over some of the strings of memory cells, and based at least partially on the observed amount of pillar bending, forming a slot structure between some neighboring upper pillars, the slot structure exhibiting a non-linear shape.

Some embodiments of the disclosure include a microelectronic device. The microelectronic device includes a stack structure comprising a vertically alternating sequence of conductive structures and insulative structures arranged in tiers, the stack structure divided into block structures separated from one another by slot structures, lower pillars vertically extending through the block structures of the stack structure, the lower pillars exhibiting pillar bending in a first direction, each of the lower pillars having a lowermost surface and an uppermost surface that is not vertically aligned with the lowermost surface of the pillar, an additional stack structure vertically overlying the stack structure and comprising a vertically alternating sequence of additional conductive structures and additional insulative structures arranged in additional tiers, and upper pillars extending through the additional stack structure and vertically overlying the lower pillars, each upper pillar having a lowermost surface and an uppermost surface, wherein a center of the lowermost surface of each upper pillar is aligned with a center of the uppermost surface of a corresponding pillar in the first direction.

Additional embodiments of the disclosure include a microelectronic device including strings of memory cells extending through a first stack structure comprising tiers of alternating conductive structure and insulative structures, the strings of memory cells comprising at least a dielectric material and a channel material vertically extending through the first stack structure, a second stack structure vertically overlying the first stack structure; upper pillars extending through the second stack structure and vertically overlying the strings of memory cells, a hardmask material over the second stack structure, elliptical openings extending through the hardmask material, each elliptical opening overlapping vertically with at least a portion of a respective upper pillar of the upper pillars, elliptical conductive contacts formed within the elliptical openings, each elliptical conductive contact being in contact with a respective upper pillar of the upper pillars, and access lines in electrical contact with the elliptical conductive contacts, wherein ellipse cross-sections of the elliptical conductive contacts have major axes extending in a direction perpendicular to a direction in which the access lines extend.

Embodiments of the disclosure include an electronic system. The electronic system includes an input device, an output device, a processor device operably coupled to the input device and the output device, and a memory device operably coupled to the processor device and including a microelectronic device structure. The microelectronic device structure including strings of memory cells extending through a stack structure comprising alternating levels of insulative structures and conductive structures, the strings of memory cells exhibiting pillar bending in a first direction, upper pillars within an additional stack structure comprising alternating levels of additional insulative structures and additional conductive structures, centers of lowermost portions of the upper pillars being substantially aligned with respective centers of uppermost portions of the strings of memory cells in the first direction, slot structures extending at least partially through the stack structure, the slot structures individually exhibiting a non-linear shape, elliptical conductive contacts contacting uppermost portions of the upper pillars, ellipse cross-sections of the elliptical conductive contacts have major axes extending in the first direction, and access lines in electrical contact with the elliptical conductive contacts and extending in a second direction perpendicular to the first direction.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A microelectronic device, comprising:
a stack structure comprising tiers of alternating conductive structures and insulative structures;
an additional stack structure vertically overlying the stack structure and comprising additional tiers of alternating conductive structures and insulative structures; and
lower pillars extending through the stack structure and upper pillars overlying the lower pillars and extending through the additional stack structure, the lower pillars exhibiting pillar bending in a first direction and a center of a lowermost surface of each upper pillar is aligned in the first direction with a center of an uppermost surface of a corresponding lower pillar, a center longitudinal axis through some of the upper pillars parallel to a center longitudinal axis through a corresponding lower pillar.

2. The microelectronic device of claim 1, wherein the centers of the lowermost surfaces of some of the upper pillars are not aligned in a second direction with the centers of the uppermost surfaces of the corresponding lower pillars.

3. The microelectronic device of claim 1, wherein the center longitudinal axis through some of the upper pillars is aligned with the center longitudinal axis through the corresponding lower pillar.

4. The microelectronic device of claim 1, wherein the center longitudinal axis through some of the upper pillars is offset from the center longitudinal axis through the corresponding underlying lower pillar.

5. The microelectronic device of claim 1, wherein the lower pillars are arranged in rows extending in a first lateral direction.

6. The microelectronic device of claim 5, wherein the lower pillars are arranged in columns extending in a second lateral direction.

7. The microelectronic device of claim 6, wherein the lower pillars in one column are offset in the first lateral direction from the lower pillars in neighboring columns.

8. The microelectronic device of claim 7, wherein the lower pillars in one column are aligned in the first lateral direction with the lower pillars in every other column.

9. The microelectronic device of claim 6, wherein the lower pillars in one column are aligned in the first lateral direction with the lower pillars in every other column.

10. The microelectronic device of claim 1, further comprising elliptical conductive contacts, each elliptical conductive contact electrically connected to a different one of the upper pillars.

11. The microelectronic device of claim 10, wherein each elliptical conductive contact is at least partially defined by a major axis and a minor axis, dimensions of the major axes and minor axes of the elliptical conductive contacts are at least partially determined based on an observed degree of pillar bending exhibited by the lower pillars.

12. The microelectronic device of claim 11, further comprising access lines, each access line electrically connected to at least some of the elliptical conductive contacts.

13. The microelectronic device of claim 1, further comprising slot structures formed between neighboring ones of some of the upper pillars, the slot structures exhibiting a non-linear configuration.

14. A microelectronic device, comprising:
strings of memory cells extending through a first stack structure comprising alternating conductive structures and insulative structures;
a second stack structure adjacent to the first stack structure;
pillars extending through the second stack structure and adjacent to the strings of memory cells;
elliptical openings extending through at least the second stack structure, each elliptical opening adjacent to at least a portion of a respective one of the pillars;
elliptical conductive contacts formed within the elliptical openings, each elliptical conductive contact electrically coupled to a respective one of the pillars; and
access lines electrically coupled to the elliptical conductive contacts.

15. The microelectronic device of claim 14, wherein at least one of the strings of memory cells comprises an oxide-nitride-oxide structure.

16. The microelectronic device of claim 14, wherein each elliptical conductive contact is at least partially defined by a major axis and a minor axis, the major axis extending in a first direction and the minor axis extending in a second direction.

17. The microelectronic device of claim 16, wherein some of the strings of memory cells exhibit pillar bending in the first direction.

18. The microelectronic device of claim 17, wherein the access lines extend in the second direction.

19. A microelectronic device, comprising:
a memory device comprising at least one microelectronic device structure, the at least one microelectronic device structure comprising:
strings of memory cells extending through a stack structure comprising alternating insulative structures and conductive structures, the strings of memory cells exhibiting pillar bending;
pillars within an additional stack structure comprising alternating additional insulative structures and additional conductive structures adjacent to the stack structure;
slot structures extending at least partially through the stack structure, at least some of the slot structures exhibiting a non-linear shape;
elliptical conductive contacts contacting uppermost portions of the pillars; and
access lines in electrical contact with the elliptical conductive contacts.

20. The microelectronic device of claim 19, wherein the strings of memory cells comprise either strings of metaloxide-nitride-oxide-semiconductor memory cells, strings of tantalum nitride-aluminum oxide-nitride-oxide-semiconductor memory cells, or strings of band/barrier engineered tantalum nitride-aluminum oxide-nitride-oxide-semiconductor memory cells.

\* \* \* \* \*